United States Patent
Kawaguchi

(10) Patent No.: US 7,580,103 B2
(45) Date of Patent: Aug. 25, 2009

(54) ELECTRO-OPTICAL DEVICE, METHOD OF MOUNTING WIRING SUBSTRATE, AND ELECTRONIC APPARATUS

(75) Inventor: Yoshito Kawaguchi, Matsumoto (JP)

(73) Assignee: Epson Imaging Devices Corporation, Azumino (JP)

(*) Notice: Subject to any disclaimer, the term of this patent is extended or adjusted under 35 U.S.C. 154(b) by 242 days.

(21) Appl. No.: 11/374,100

(22) Filed: Mar. 14, 2006

(65) Prior Publication Data
US 2006/0221269 A1    Oct. 5, 2006

(30) Foreign Application Priority Data
Mar. 30, 2005  (JP) ............................. 2005-097195
Nov. 29, 2005  (JP) ............................. 2005-343290

(51) Int. Cl.
*G02F 1/1345* (2006.01)
*G02F 1/1333* (2006.01)

(52) U.S. Cl. .................. 349/150; 349/58; 349/110; 349/151; 349/152

(58) Field of Classification Search .................. 349/58, 349/149–152
See application file for complete search history.

(56) References Cited

U.S. PATENT DOCUMENTS

| | | | |
|---|---|---|---|
| 6,613,599 B2* | 9/2003 | Imaeda | 438/30 |
| 6,657,696 B2* | 12/2003 | Aruga | 349/150 |
| 6,741,301 B2* | 5/2004 | Tsuji | 349/58 |
| 6,954,184 B2* | 10/2005 | Kurashima et al. | 345/1.3 |
| 7,034,799 B2* | 4/2006 | Lee | 345/102 |
| 7,079,200 B2* | 7/2006 | Saito et al. | 349/58 |
| 7,113,236 B2* | 9/2006 | Du | 349/58 |
| 7,161,650 B2* | 1/2007 | Hirano | 349/150 |
| 7,224,423 B2* | 5/2007 | Ono | 349/150 |
| 7,233,382 B2* | 6/2007 | Yamaji et al. | 349/150 |
| 7,271,944 B2* | 9/2007 | Yamada | 359/245 |
| 7,453,532 B2* | 11/2008 | Kondo et al. | 349/58 |
| 2002/0117669 A1* | 8/2002 | Aruga | 257/59 |
| 2003/0063456 A1* | 4/2003 | Katahira | 362/27 |
| 2003/0117543 A1* | 6/2003 | Chang | 349/58 |
| 2005/0088830 A1* | 4/2005 | Yumoto et al. | 361/749 |

FOREIGN PATENT DOCUMENTS

JP    A 2002-287144    10/2002

* cited by examiner

*Primary Examiner*—Brian M. Healy
*Assistant Examiner*—Hung Lam
(74) *Attorney, Agent, or Firm*—Oliff & Berridge, PLC

(57) ABSTRACT

An electro-optical device includes an electro-optical panel which displays an image on a display surface; a supporting member which supports the electro-optical device; and a flexible wiring substrate which is connected to the electro-optical device. The wiring substrate is bent such that at least a portion of a surface of the wiring substrate is opposite to a side surface of the supporting member, in regions other than a side of the wiring substrate connected to the electro-optical panel.

17 Claims, 18 Drawing Sheets

ELECTRO-OPTICAL DEVICE, METHOD OF MOUNTING WIRING SUBSTRATE, AND ELECTRONIC APPARATUS

This application claims the benefit of Japanese Patent Application No. 2005-097195, filed Mar. 30, 2005 and Japanese Patent Application No. 2005-343290, filed Nov. 29, 2005. The entire disclosure of the prior applications is hereby incorporated by reference herein in its entirety.

BACKGROUND

1. Technical Field

The present invention relates to an electro-optical device, such as a liquid crystal display device, to a method of mounting a wiring substrate to an electro-optical panel included in an electro-optical device, and to an electronic apparatus using an electro-optical device.

2. Related Art

In recent years, electro-optical devices, such as liquid crystal display devices and electroluminescent (EL) devices, have come into widespread use for various electronic apparatuses, such as cellular phones and portable information terminals. For example, the electro-optical device is used as a display unit for visibly displaying various information items related to an electronic apparatus. For example, a liquid crystal display device using liquid crystal as an electro-optical material has been known as the electro-optical device.

In the liquid crystal display device, the liquid crystal, which is an electro-optical material, is injected between a pair of substrates, thereby forming a liquid crystal panel, which is a panel structure, serving as an electro-optical panel. In general, a wiring substrate, for example, an FPC (flexible printed circuit) substrate is connected to the liquid crystal panel in order to apply a predetermined voltage to the liquid crystal (for example, JP-A-2002-287144 (see page 4 and FIG. 4).

A circuit required for driving the liquid crystal panel is formed on the FPC substrate. In general, the circuit is formed by forming wiring lines on a base substrate in a predetermined pattern and by mounting electronic elements, such as ICs, capacitors, coils, and resistors, on the base substrate at predetermined positions. In addition, input terminals are formed on the FPC substrate, and an external power source and various external devices are connected to the input terminals. In this way, signals and power for driving the liquid crystal panel are respectively supplied from the external devices or the external power sources through the FPC substrate.

However, in a liquid crystal display device disclosed in JP-A-2002-287144, a flat FPC substrate is provided as a wiring substrate. Therefore, when a large circuit is formed on the FPC substrate, the size of the liquid crystal display device having the FPC substrate connected thereto increases. Meanwhile, when the size of the liquid crystal display device is reduced, it is difficult to form a large circuit on the FPC substrate, which makes it difficult to reduce the liquid crystal display device.

SUMMARY

An advantage of some aspects of the invention is that it provides a technique for reducing the size of an electro-optical device provided with a flexible wiring substrate, such as an FPC substrate, even if a large circuit is formed on the wiring substrate.

According to an aspect of the invention, an electro-optical device includes an electro-optical panel which displays an image on a display surface; a supporting member which supports the electro-optical device; and a flexible wiring substrate which is connected to the electro-optical device. The wiring substrate is bent such that at least a portion of a surface of the wiring substrate is opposite to a side surface of the supporting member, in regions other than a side of the wiring substrate connected to the electro-optical panel.

In the above-mentioned structure, the electro-optical panel is a panel structure capable of changing an optical output state by controlling electrical input conditions. In addition, the electro-optical panel is a panel structure including an electro-optical material, such as liquid crystal, and performs display using an electro-optical operation of the electro-optical material. The electro-optical panel is formed by arranging an electro-optical material on a substrate formed of, for example, glass, or by injecting an electro-optical material between a pair of substrates. When, for example, the liquid crystal is used as the electro-optical material, a liquid crystal panel, serving as an electro-optical panel, is formed.

According to the electro-optical device of this aspect, the wiring substrate is bent such that at least a portion of the surface of the wiring substrate is opposite to the side surface of the supporting member, in regions other than a side of the wiring substrate connected to the electro-optical panel. Therefore, even when the size of the supporting member decreases in order to reduce the size of the electro-optical device, it is possible to ensure a large area required for forming a circuit on the wiring substrate. That is, this structure makes it possible to reduce the size of an electro-optical device. On the other hand, it is possible to increase the substantial area of the wiring substrate and thus to form a large circuit on the wiring substrate.

Further, in the above-mentioned structure, it is preferable that the wiring substrate be bent toward a rear surface of the electro-optical panel. According to this structure, it is possible to overlap the wiring substrate with the region of the electro-optical panel, as viewed from the display surface, and thus to further reduce the size of an electro-optical device including the wiring substrate.

Furthermore, in the above-mentioned structure, it is preferable that the supporting member be a case which accommodates the electro-optical panel. The case is formed of, for example, resin and accommodates the electro-optical panel to regulate the position of the electro-optical panel in the plane direction. Thus, the electro-optical panel is always placed at a fixed position in the case.

In the electro-optical device according to this aspect, the peripheral edge of the case protrudes from the edges of the other components, and the size of the electro-optical device is substantially equal to that of the case. Therefore, when at least a portion of the surface of the wiring substrate is bent so as to be opposite to the side surface of the case, it is possible to prevent an increase of the size of an electro-optical device due to the wiring substrate protruding from the case.

Moreover, in the electro-optical device according to this aspect, preferably, the surface of the wiring substrate which is bent so as to be opposite to the side surface of the supporting member is adhered to the side surface of the supporting member. According to this structure, it is possible to prevent the bent wiring substrate from returning to its original state due to elasticity. In addition, the adhesion can be executed by applying an adhesive, or it can be performed by interposing a double-sided adhesive tape therebetween.

Further, in the above-mentioned structure, preferably, the electro-optical device further includes a frame which covers the side surface of the supporting member, and a portion of the wiring substrate which is bent so as to be opposite to the side surface of the supporting member is pressed by the frame. According to this structure, it is possible to prevent a portion of the surface of the wiring substrate, which is bent so as to be opposite to the side surface of the supporting member, from being separated from the side surface of the supporting member due to the elasticity of the wiring substrate.

Further, since a portion of the wiring substrate which is bent so as to be opposite to the side surface of the supporting member is pressed against the side surface of the supporting member by the frame, a double-sided adhesive tape may be not needed to adhere the portion to the supporting member. Therefore, it is possible to easily separate the wiring substrate from the supporting member without peeling off the double-sided adhesive tape, and thus to easily disassemble the electro-optical device. In this way, when a manufacturing defect occurs when the electro-optical device is assembled, it is possible to easily disassemble and reassemble the electro-optical device.

Furthermore, in the electro-optical device according to this aspect, it is preferable that the wiring substrate have wiring lines and a protective film formed on the wiring lines, and that the protective film be not formed in the portion of the wiring substrate which is bent so as to be opposite to the side surface of the supporting member. According to this structure, it is possible to reduce the thickness of the bent portion of the wiring substrate or to reduce the rigidity of the bent portion. Thus, the wiring substrate can be easily bent.

Moreover, in the electro-optical device according to this aspect, it is preferable that a slit be formed in the bent portion of the wiring substrate. The silt means a space, particularly, an elongated space. When the slit is formed in the bent portion of the wiring substrate, the silt enables the wiring substrate to be bent easier.

Further, in the electro-optical device according to this aspect, it is preferable that a cutout be provided in an end portion of the bent portion of the wiring substrate. According to this structure, it is possible to accurately position the bent portion when the wiring substrate is bent.

According to another aspect of the invention, an electro-optical device includes a first electro-optical panel; a second electro-optical panel which is provided on a rear side of the first electro-optical panel; a supporting member which supports the first electro-optical panel and the second electro-optical panel; a first flexible wiring substrate which is connected to the first electro-optical panel and is bent toward the second electro-optical panel of the supporting member; and a second flexible wiring substrate which is connected to the second electro-optical panel. In addition, at least one of the first wiring substrate and the second wiring substrate is bent such that a portion of a surface of the wiring substrate is opposite to a side surface of the supporting member.

In this aspect of the invention, the following structures are considered: (1) a portion of the first wiring substrate is bent so as to be opposite to the side surface of the supporting member; (2) a portion of the second wiring substrate is bent so as to be opposite to the side surface of the supporting member; and (3) portions of the first and second wiring substrates are bent so as to be opposite to the side surface of the supporting member. In all the structures, even when the supporting member is formed in a small size in order to reduce the size of the electro-optical device, at least one of the first and second wiring substrates can have a large area required for forming a circuit, which makes it possible to reduce the size of an electro-optical device having the wiring substrate. On the other hand, it is possible to increase the substantial area of at least one of the first and second wiring substrates and to form a large circuit on the wiring substrate.

Further, in the electro-optical device according to this aspect, it is preferable that the first wiring substrate be bent such that regions other than a side thereof connected to the first electro-optical panel are opposite to the side surface of the supporting member. In the electro-optical device provided with the first electro-optical panel and the second electro-optical panel, the first wiring substrate bent toward the second electro-optical panel is generally arranged in the vicinity of the second electro-optical panel so as not to prevent the display of the second electro-optical panel. Therefore, in this case, it is necessary to ensure a sufficient space to arrange the wiring substrate in the vicinity of the second electro-optical panel, which makes it difficult to reduce the size of an electro-optical device.

In contrast, according to the electro-optical device of this aspect, the first wiring substrate is bent such that regions other than a side thereof connected to the first electro-optical panel are opposite to the side surface of the supporting member. Therefore, even when the supporting member is formed in a small size in order to reduce the size of the electro-optical device, it is possible to ensure an area required for forming a circuit on the first wiring substrate, which makes it possible to reduce the size of the electro-optical device having the first wiring substrate. On the other hand, it is possible to increase the substantial area of the first wiring substrate and to form a large circuit on the first wiring substrate.

According to still another aspect of the invention, a method of mounting a wiring substrate includes: connecting a flexible wiring substrate to an electro-optical panel which displays an image on a display surface; putting the electro-optical panel in a supporting member; bending the wiring substrate toward a rear surface of the electro-optical panel; and bending at least a portion of a surface of the wiring substrate so as to be opposite to a side surface of the supporting member in regions other than a part of the wiring substrate connected to the electro-optical panel.

In the method of mounting a wiring substrate according to this aspect, the wiring substrate is bent toward the rear surface of the electro-optical panel in the bending of the wiring substrate and is further bent such that at least a portion of the surface thereof is opposite to the side surface of the supporting member in regions other than a side of the wiring substrate connected to the electro-optical panel in the bending at least a portion of wiring substrate. Therefore, even when the supporting member is formed in a small size in order to reduce the size of the electro-optical device, it is possible to ensure a large area required for forming a circuit on the wiring substrate, which makes it possible to reduce the size of the electro-optical device having the wiring substrate. On the other hand, it is possible to increase the substantial area of the first wiring substrate and to form a large circuit on the first wiring substrate.

According to yet another aspect of the invention an electronic apparatus includes the above-mentioned electro-optical device. In the electro-optical device of the above-mentioned aspect, even when the supporting member is formed in a small size in order to reduce the size of the electro-optical device, it is possible to ensure a large area required for forming a circuit on the wiring substrate, which makes it possible to reduce the size of the electro-optical device having the wiring substrate. Thus, according to this aspect, it is possible to reduce the total size of an electronic apparatus having the electro-optical device according to this aspect.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
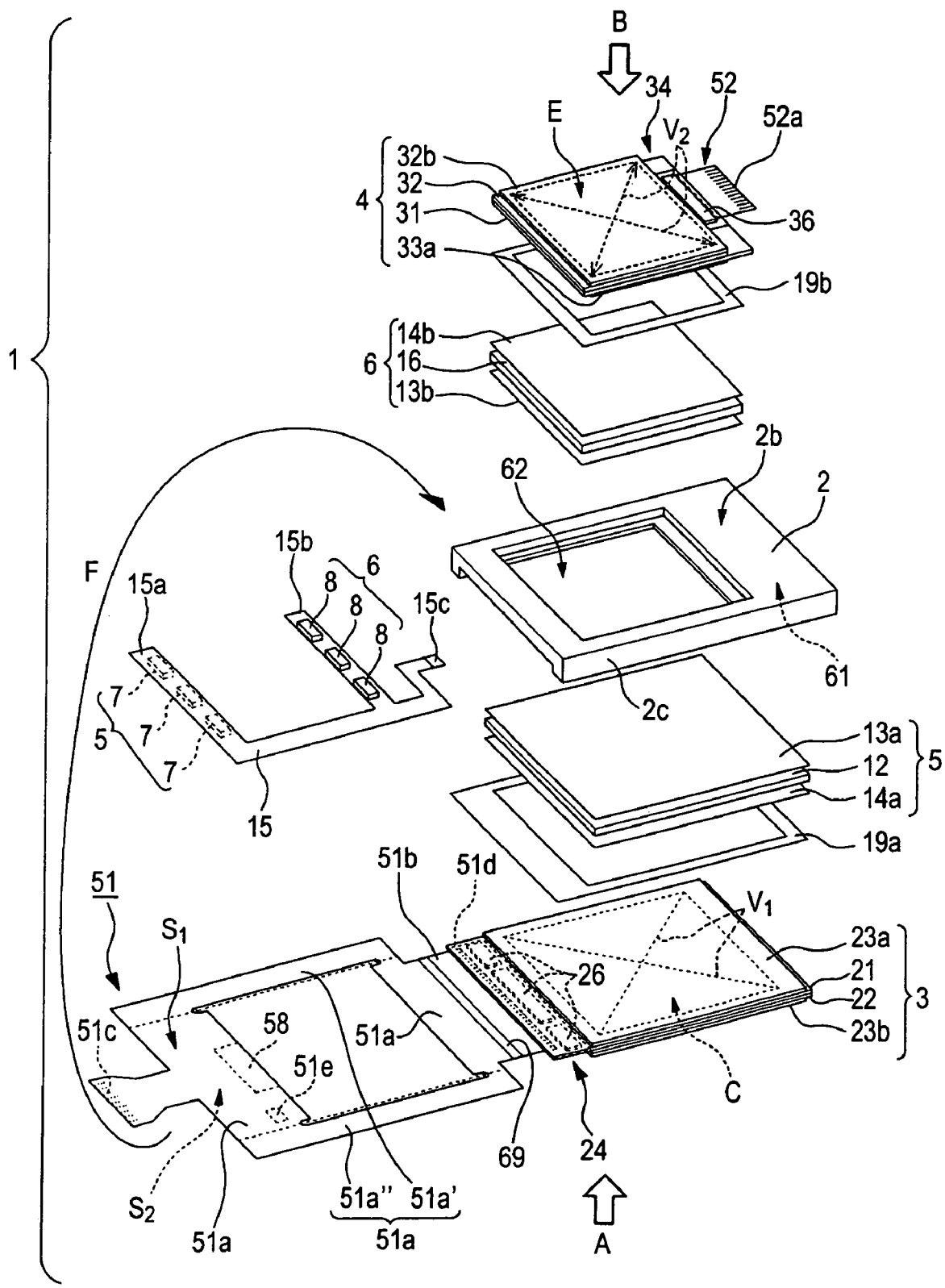
FIG. 1 is an exploded perspective view illustrating a liquid crystal display device which is an embodiment of an electro-optical device according to the invention.

First Embodiment of Electro-Optical Device and Method of Mounting Wiring Substrate Hereinafter, an electro-optical device according to an embodiment of the invention will be described. However, the invention is not limited to this embodiment. In addition, note that a scale of each component is adjusted in order to have a recognizable size in the drawings used for describing the invention.

Figure 2:
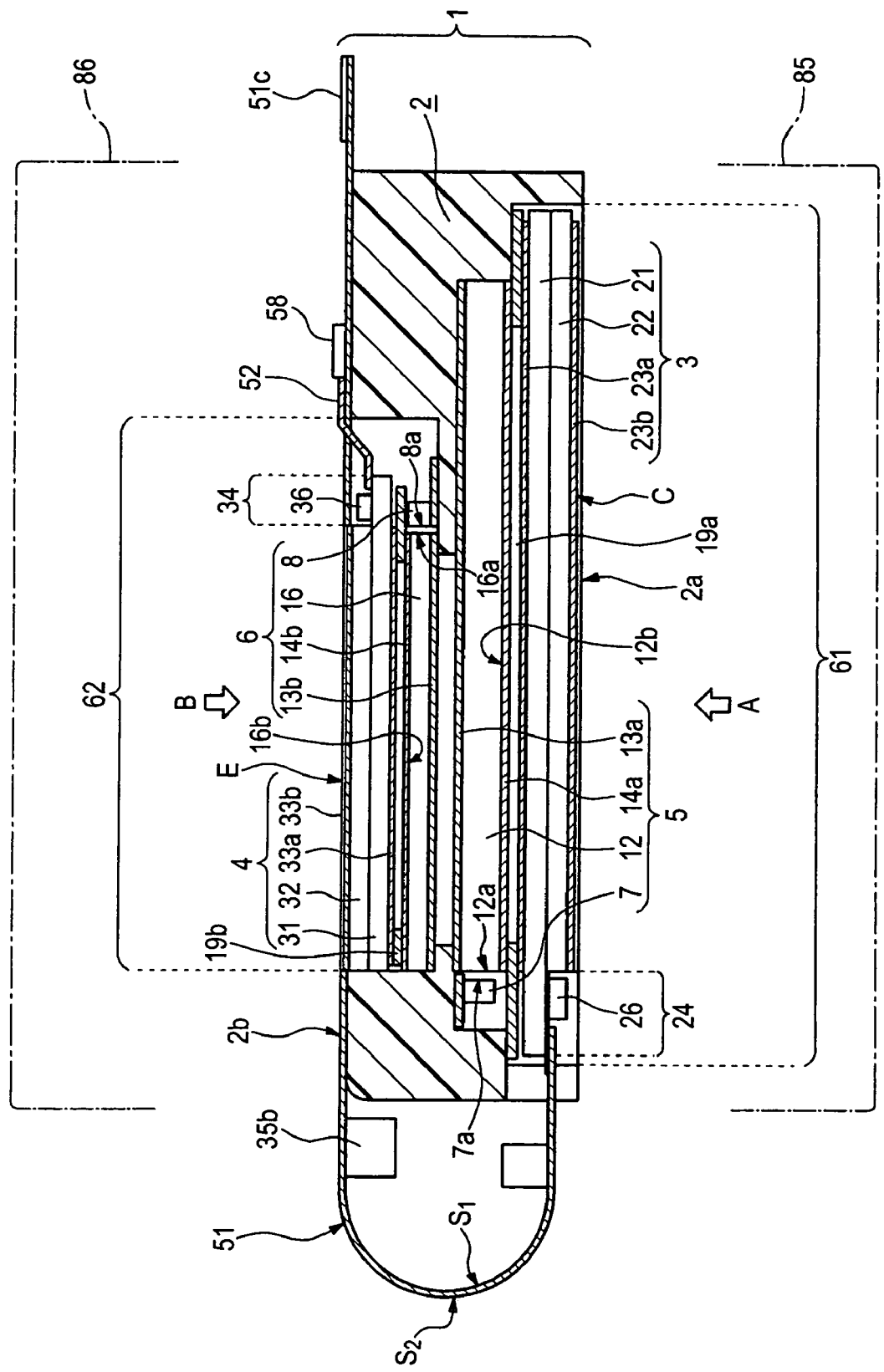
FIG. 2 is a cross-sectional view illustrating the structure of the liquid crystal display device shown in FIG. 1.

FIG. 1 is an exploded perspective view illustrating a liquid crystal display device 1, which is an example of the electro-optical device according to the invention. FIG. 2 is a cross-sectional view illustrating the structure of the liquid crystal display device 1 of FIG. 1 in an assembled state. In FIG. 1, the liquid crystal display device 1 includes a case 2, serving as a supporting member, a first liquid crystal panel 3, serving as a first electro-optical panel, which is supported by the case 2, and a second liquid crystal panel 4, serving as a second electro-optical panel, which is supported by the case 2. In this embodiment, the first liquid crystal panel 3 is a display member for performing a main display operation, and the second liquid crystal panel 4 is a display member for performing a secondary display operation.

A first illumination device 5 is provided between the first liquid crystal panel 3 and the case 2. The first illumination device 5 includes a first LED (light emitting diode) 7, serving as a light source, particularly, a point light source, and a first optical waveguide 12 which converts point light emitted from the first LED 7 into surface light and emits the surface light to the outside thereof. The first optical waveguide 12 is formed of, for example, a transmissive resin.

In this embodiment, a plurality of first LEDs 7, for example, three first LEDs 7 are provided. For example, the three first LEDs 7 are mounted on a first mounting region 15a of an LED substrate 15, which is a flexible substrate. The LED substrate 15 includes terminals 15c, and power is supplied to the first LEDs 7 through the terminals 15c. As shown in FIG. 2, each first LED 7 is provided such that an emission surface 7a thereof is opposite to a light incident surface 12a, which is one side surface of the first optical waveguide 12. Light emitted from each first LED 7 is introduced into the first optical waveguide 12 through the light incident surface 12a, and is then emitted from a light emission surface 12b of the first optical waveguide 12 as surface light to be supplied to the first liquid crystal panel 3.

A reflective layer 13a is provided on a rear surface of the first optical waveguide 12, as viewed from the direction of arrow A. In addition, a light diffusing layer 14a is provided on the light emission surface 12b of the first optical waveguide 12. The first illumination device 5 is provided on the rear side of the first liquid crystal panel 3, as viewed from the direction of arrow A, to function as a backlight. Layers having optical characteristics other than the light diffusing layer 14a may be provided on the light emission surface 12b of the first optical waveguide 12, if necessary. Further, point light sources other than the first LED 7 or linear light sources, such as a cold-cathode tube, may be used as the light source.

Referring to FIG. 1 again, a second illumination device 6 is provided between the second liquid crystal panel 4 and the case 2. The second illumination device 6 includes a second LED 8 and a second optical waveguide 16 which converts point light emitted from the second LED 8 into surface light and emits the surface light to the outside thereof. The second optical waveguide 16 is formed of, for example, a transmissive resin. A plurality of second LEDs 8, for example, three second LEDs 8 are provided in this embodiment. The three second LEDs 8 are mounted on a second mounting region 15b of the LED substrate 15, and power is supplied to the second LEDs 8 through the terminals 15c. As shown in FIG. 2, each second LED 8 is provided such that an emission surface 8a thereof is opposite to a light incident surface 16a, which is one side surface of the second optical waveguide 16. Light emitted from each second LED 8 is introduced into the second optical waveguide 16 through the light incident surface 16a, and is then emitted from a light emission surface 16b of the second optical waveguide 16 as surface light to be supplied to the second liquid crystal panel 4.

A reflective layer 13b is provided on a rear surface of the second optical waveguide 16, as viewed from the direction of arrow B. In addition, a light diffusing layer 14b is provided on the light emission surface 16b of the second optical waveguide 16. The second illumination device 6 is provided on the rear side of the second liquid crystal panel 4, as viewed from the direction of arrow B, to function as a backlight. Layers having optical characteristics other than the light diffusing layer 14b may be provided on the light emission surface 16b of the second optical waveguide 16, if necessary.

Further, an adhesive sheet 19a is provided between the first illumination device 5 and the first liquid crystal panel 3. In FIG. 1, the adhesive sheet 19a is formed in a frame shape with an opening having the substantially same size as that of a display region V1 of the first liquid crystal panel 3. In addition, the adhesive sheet 19a is formed of a light shielding material. The case 2 and the first liquid crystal panel 3 are bonded to each other by the adhesive sheet 19a. In this case, the adhesive sheet has adhesion as strong as it can be peeled off by hands. As shown in FIG. 2, the first illumination device 5 and the first liquid crystal panel 3 are accommodated into the case 2.

In FIG. 1, an adhesive sheet 19b is provided between the second liquid crystal panel 4 and the case 2. The adhesive sheet 19b is formed in a frame shape with an opening having the substantially same size as that of a display region V2 of the second liquid crystal panel 4. In addition, the adhesive sheet 19b is formed of a light shielding material. The case 2 and the second liquid crystal panel 4 are bonded to each other by the adhesive sheet 19b. As shown in FIG. 2, the second illumination device 6 and the second liquid crystal panel 4 are accommodated into the case 2.

In FIG. 1, the first liquid crystal panel 3 includes a first transmissive substrate 21, a second transmissive substrate 22, a polarizing plate 23a attached to an outer surface of the first transmissive substrate 21, and a polarizing plate 23b attached to an outer surface of the second transmissive substrate 22. The polarizing axis of the polarizing plate 23a appropriately deviates from that of the polarizing plate 23b. In addition, optical elements other than the polarizing plates 23a and 23b, such as retardation plates, may be provided.

As shown in FIG. 2, the first transmissive substrate 21 includes a extended section 24 projecting from one side of the second transmissive substrate 22. A driving IC 26 is mounted on the extended section 24 by a COG (chip on glass) technique using, for example, an ACF (anisotropic conductive film).

Referring to FIG. 1 again, the second liquid crystal panel 4 includes a first transmissive substrate 31, a second transmissive substrate 32, a polarizing plate 33a attached to an outer surface of the first transmissive substrate 31, and a polarizing plate 33b attached to an outer surface of the second transmissive substrate 32. The polarizing axis of the polarizing plate 33a appropriately deviates from that of the polarizing plate 33b. In addition, optical elements other than the polarizing plates 33a and 33b, such as retardation plates, may be provided. As shown in FIG. 2, the first transmissive substrate 31 includes a extended section 34 projecting from one side of the second transmissive substrate 32. A driving IC 36 is mounted on the extended section 34 by the COG (chip on glass) technique using, for example, an ACF (anisotropic conductive film).

Although not shown in detail in the drawings, electrodes are provided on opposing surfaces of the first and second transmissive substrates 21 and 22 constituting the first liquid crystal panel 3, and liquid crystal is sealed between these substrates. Similarly, electrodes are provided on opposing surfaces of the first and second transmissive substrates 31 and 32 constituting the second liquid crystal panel 4, and liquid crystal is sealed between these substrates. When surface light is emitted from the first illumination device 5 to the first liquid crystal panel 3 and surface light is emitted from the second illumination device 6 to the second liquid crystal panel 4, light passing through the liquid crystal is modulated in every pixel by controlling, for every pixel, a voltage applied to a pair of electrodes which are opposite to each other in each of the liquid crystal panels 3 and 4.

Therefore, in the first liquid crystal panel 3, the modulated light passes through the polarizing plate 23b, which causes, for example, characters, numbers, or figures to be displayed on the light emission side of the polarizing plate 23b as images. The direction represented by arrow A is a direction in which an image displayed on the first liquid crystal panel 3 is viewed, and a surface of the first liquid crystal panel 3 having the polarizing plate 23b provided thereon serves as a display surface C. Meanwhile, in the second liquid crystal panel 4, the modulated light passes through the polarizing plate 33b, which causes, for example, characters, numbers, or figures to be displayed on the light emission side of the polarizing plate 33b as images. The direction represented by arrow B is a direction in which an image displayed on the second liquid crystal panel 4 is viewed, and a surface of the second liquid crystal panel 4 having the polarizing plate 33b provided thereon serves as a display surface E.

It is possible to use liquid panels having the same display mode for the first and second liquid crystal panels 3 and 4. In addition, these liquid crystal panels can have arbitrary display modes. For example, a liquid crystal driving method of a simple-matrix-type or an active-matrix-type may be used. The types of liquid crystal modes include, for example, TN (twisted nematic) liquid crystal, STN (super twisted nematic) liquid crystal, and liquid crystal having negative dielectric anisotropy (that is, vertical-alignment-type liquid crystal). In addition, an illuminating method includes, for example, a reflective type, a transmissive type, and a transflective type using both the reflective type and the transmissive type.

In the reflective type, external light, such as sunlight or illumination light, is reflected from the insides of the first and second liquid crystal panels 3 and 4 to be used for display. In the transmissive type, light passes through the first and second liquid crystal panels 3 and 4 to be used for display. In the transflective type, reflective display and transmissive display can be selectively performed. In this embodiment, since the first and second illumination devices 5 and 6 are provided as backlights, the transmissive type or the transflective type is used as the illuminating method.

In the simple-matrix-type, an active element is provided in each pixel, and a driving signal is directly applied to a pixel or dot corresponding to an intersection of a scanning electrode and a data electrode. The TN, STN, and vertical-alignment-type liquid crystal modes correspond to the simple-matrixtype. In the active-matrix-type, an active element is provided in each pixel or dot, and the active element is turned on in a writing period, causing a data voltage to be written. In addition, the active element is turned off in the other periods, causing a voltage to be held. A three-terminal active element or a two-terminal active element is used for the active-matrix-type. The three-terminal active element includes, for example, a TFT (thin film transistor). In addition, the two-terminal active element includes, for example, a TFD (thin film diode).

In the first and second liquid crystal panels 3 and 4, when color display is performed, color filters are provided in one of the two liquid crystal panels. A color filter is formed of a plurality of filters which selectively transmits light within a specific wavelength band. For example, the color filter is formed by aligning B (blue), G (green), and R (red) color filters so as to correspond to the pixels on the substrate one by one in a predetermined arrangement, for example, a stripe arrangement, a delta arrangement, or a mosaic arrangement.

Figure 3:
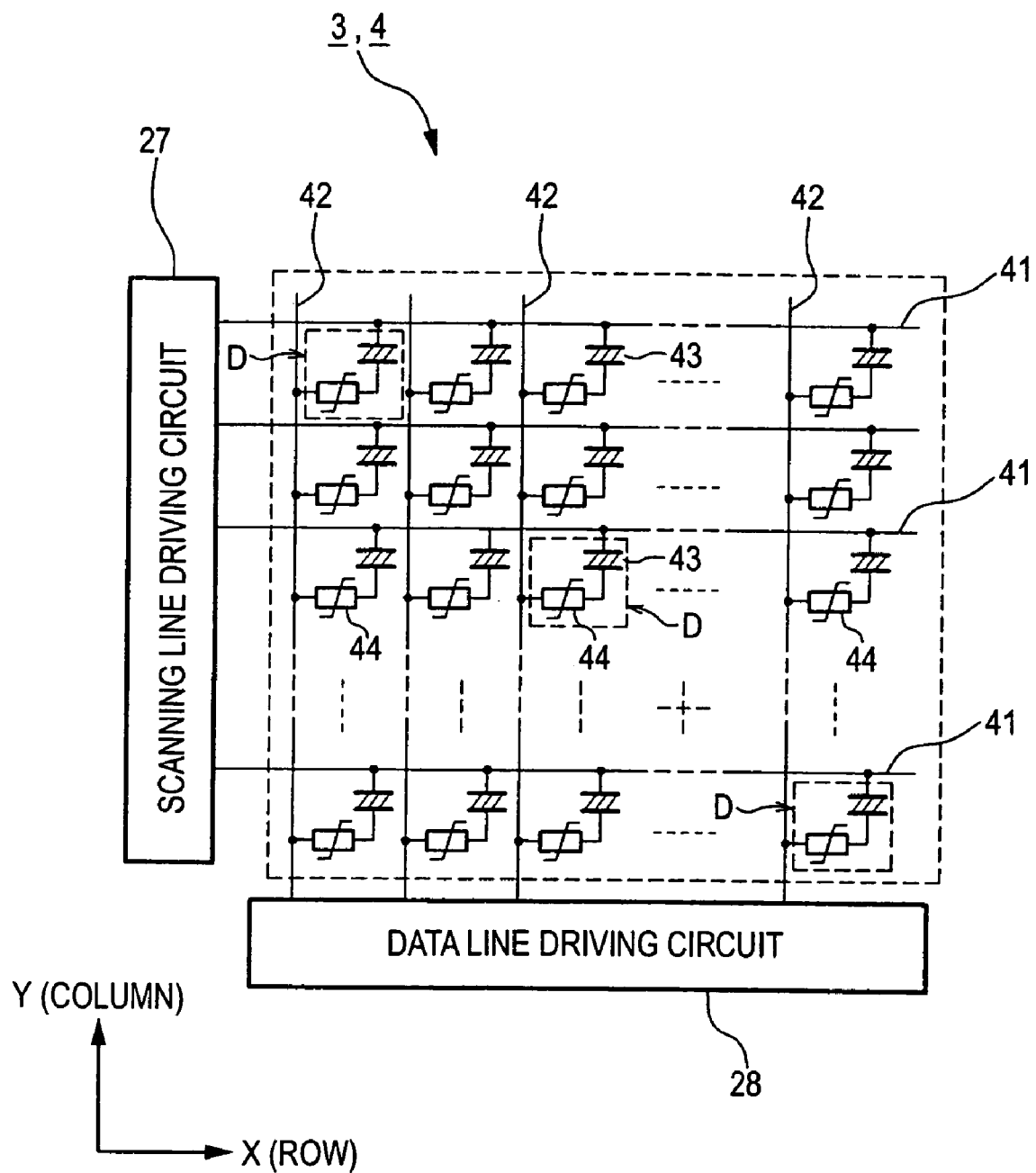
FIG. 3 is a circuit diagram illustrating an example of an electrical equivalent circuit of the liquid crystal display device shown in FIG. 1.

If active-matrix-type liquid crystal panels using TFD elements are used as the first liquid crystal panel 3 and the second liquid crystal panel 4, an electrical equivalent circuit thereof is as shown in FIG. 3. Referring to FIG. 3, a plurality of scanning lines 41 are formed to extend in a row direction X, and a plurality of data lines 42 are formed to extend in a column direction Y. The scanning lines 41 are formed as band-shaped electrodes on a substrate, on which the TFD elements are not provided, from the first transmissive substrates 21 and 31 or the second transmissive substrates 22 and 32 shown in FIG. 2. Further, the data lines 42 of FIG. 3 are formed as linear wiring lines on a substrate, on which the TFD elements are provided, from the first transmissive substrates 21 and 31 or the second transmissive substrates 22 and 32 shown in FIG. 2.

Referring to FIG. 3, subpixels D serving as the minimum display unit are individually formed at intersections of the scanning lines 41 and the data lines 42. In each subpixel D, a liquid crystal layer 43 and a TFD element 44 are connected in series. When color display is performed by associating one of color filters of blue (B), green (G), and red (R) with each subpixel D, the subpixels D of three colors form one pixel. On the other hand, at the time of monocolor display, such as black-white or the like, one subpixel D forms one pixel.

In FIG. 3, the liquid crystal layer 43 is connected to the corresponding scanning line 41, and the TFD element 44 is connected to the corresponding data line 42, but the connection relationship may be reversed. The individual scanning lines 41 are driven by a scanning line driving circuit 27. On the other hand, the individual data lines 42 are driven by a data line driving circuit 28. The scanning line driving circuit 27 and the data line driving circuit 28 are constituted by the driving ICs 26 and 36 shown in FIG. 2. As for the driving ICs 26 and 36, a common IC may constitute both driving circuits 27 and 28 shown in FIG. 3. Further, both driving circuits 27 and 28 may be allocated to different ICs.

Figure 4:
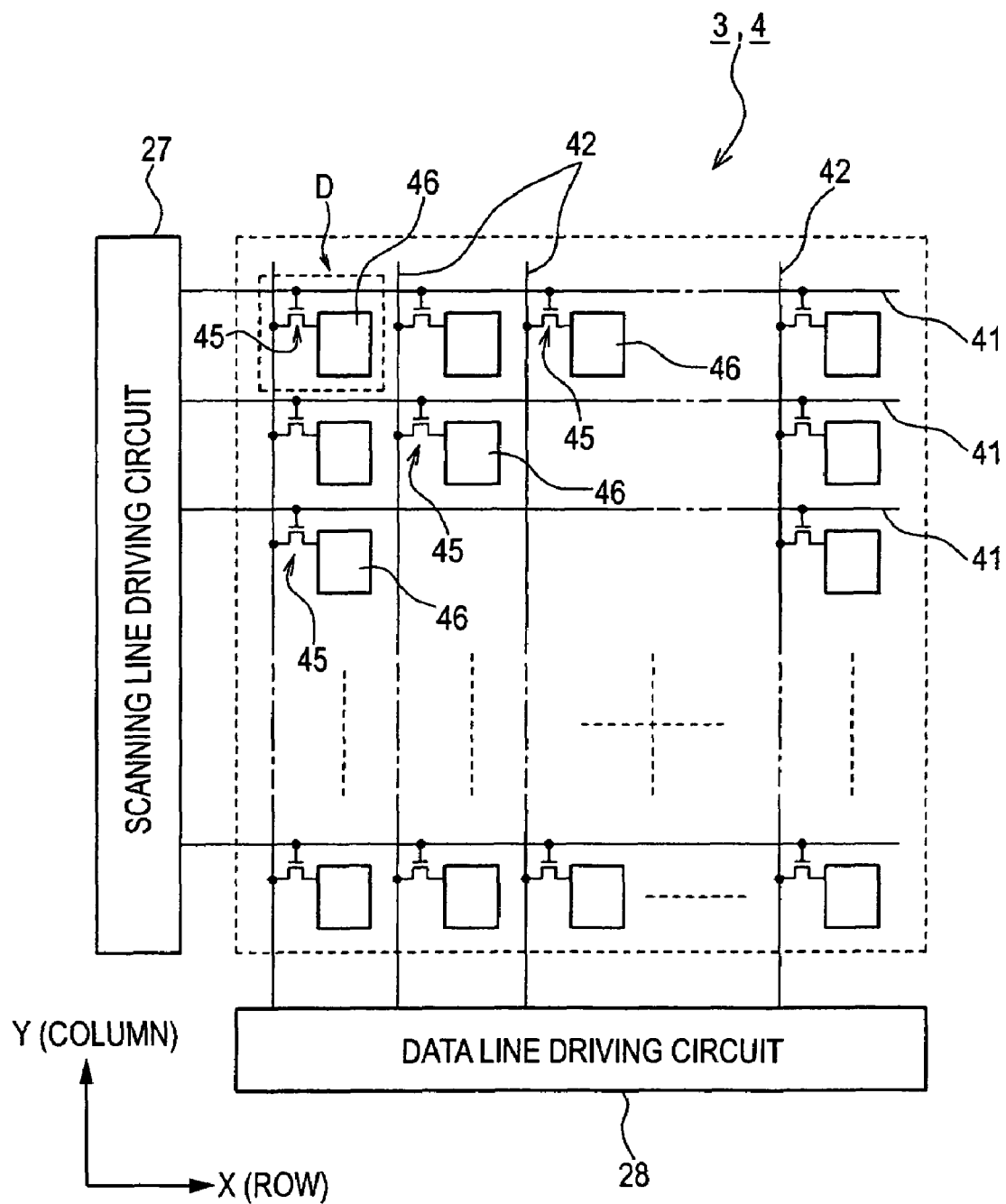
FIG. 4 is a circuit diagram illustrating another example of the electrical equivalent circuit of the liquid crystal display device shown in FIG. 1.

On the other hand, when active matrix-type liquid crystal panels using TFT elements are used as the first liquid crystal panel 3 and the second liquid crystal panel 4, an electrical equivalent circuit thereof is as shown in FIG. 4. Referring to FIG. 4, a plurality of scanning lines 41 are formed to extend in a row direction X. Further, a plurality of data lines 42 are formed to extend in a column direction Y. The scanning lines 41 are formed as lines, each of which is connected to a gate electrode of a TFT element formed on one of the first transmissive substrates 21 and 31 or the second transmissive substrates 22 and 32 shown in FIG. 2, and the data lines 42 shown in FIG. 4 are formed as lines, each of which is connected to a source electrode of the TFT element. On a substrate, on which the TFT elements are not formed, from the first transmissive substrates 21 and 31 or the second transmissive substrates 22 and 32 shown in FIG. 2, a planar common electrode is formed.

Referring to FIG. 4, subpixels D are individually formed at intersections of the scanning lines 41 and the data lines 42. In each subpixel D, a TFT element 45 and a pixel electrode 46 are connected in series. The individual scanning lines 41 are driven by the scanning line driving circuit 27. On the other hand, the individual data lines 42 are driven by the data line driving circuit 28. The scanning line driving circuit 27 and the data line driving circuit 28 are constituted by the driving ICs 26 and 36 shown in FIG. 2.

A scanning signal is transmitted to the gate of the TFT element 45 shown in FIG. 4, and a data signal is transmitted to the source of the TFT element 45. If the TFT element 45 becomes an ON state, the connection to the corresponding pixel electrode 46 is made, and then writing into liquid crystal in the corresponding subpixel D is performed. Subsequently, if the TFT element 45 becomes an OFF state, the written state is held. With a series of writing operation and holding operation, liquid crystal molecules are controlled.

Returning to FIG. 1, a first FPC substrate 51 serving as a flexible wiring substrate is connected to an end side of an extended section 24 of the first transmissive substrate 21 of the first liquid crystal panel 3 by using an ACF, for example. At the time of assembling the liquid crystal display device 1, the first FPC substrate 51 is bent to surround one side of the case 2, as indicated by an arrow F, and is disposed on the surface of the case 2 opposite to the display surface C of the first liquid crystal panel 3. Further, a second FPC substrate 52 serving as a flexible wiring substrate is connected to an end side of the extended section 34 of the first transmissive substrate 31 of the second liquid crystal panel 4 by using an ACF, for example. The first FPC substrate 51 and the second FPC substrate 52 will be described below in detail.

Next, the case 2 has a first housing space 61 and a second housing space 62. The first housing space 61 is provided in a first surface 2a of the case 2 indicated by the arrow A in FIG. 2. The first housing space 61 is a space formed inside the case 2, and the first liquid crystal panel 3 and the first illumination device 5 are housed in the space. Further, the second housing space 62 is provided in a second surface 2b of the case 2 indicated by the arrow B. The second housing space 62 is a space formed inside the case 2, and the second liquid crystal panel 4 and the second illumination device 6 are housed in the space.

At the time of assembling the liquid crystal display device 1 of FIG. 1, first, the first illumination device 5, the first liquid crystal panel 3, the second illumination device 6, and the second liquid crystal panel 4 are mounted on the case 2, as shown in FIG. 2. At the time of mounting, in FIG. 1, the first illumination device 5 is housed in the first housing space 61, and then the first liquid crystal panel 3 is adhered to the first illumination device 5 and the case 2 by the adhesive sheet 19a. At this time, the horizontal positions and the positions perpendicular to the paper in FIG. 2 of the first liquid crystal panel 3 and the first illumination device 5 are regulated by the first housing space 61, and thus the first liquid crystal panel 3 and the first illumination device 5 are constantly positioned at predetermined positions in the case 2.

Next, in FIG. 1, the second illumination device 6 is housed in the second housing space 62, and then the second liquid crystal panel 4 is adhered to the second illumination device 6 and the case 2 by the adhesive sheet 19b. At this time, the horizontal positions and the positions perpendicular to the paper in FIG. 2 of the second liquid crystal panel 4 and the second illumination device 6 are regulated by the second housing space 62, and thus the second liquid crystal panel 4 and the second illumination device 6 are constantly positioned at predetermined positions in the case 2.

Next, in FIG. 1, the first FPC substrate 51 is bent to surround the end side of the case 2, as indicated by the arrow F. Subsequently, the bent first FPC substrate 51 is carried on the side opposite to the display surface C of the first liquid crystal panel 3, that is, the second surface 2b of the case 2. In such a manner, the liquid crystal display device 1 shown in FIG. 2 is completed.

Figure 5A:
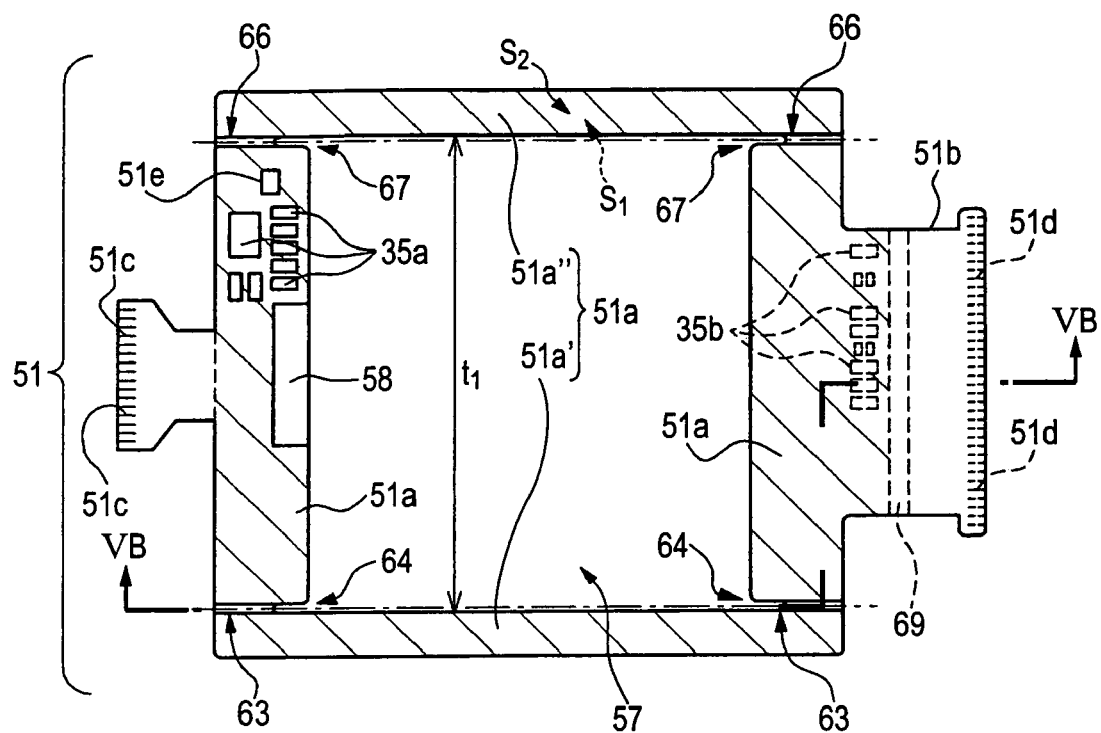
FIG. 5A is a plan view illustrating the detailed structure of a first FPC substrate which is an embodiment of a wiring substrate.

Hereinafter, the FPC substrate serving as the wiring substrate which is used in the liquid crystal display device in the present embodiment will be described in detail. FIG. 5A is a diagram of the first FPC substrate 51 of FIG. 1 as viewed from the direction of the arrow A in plan view. Further, FIG. 5B is a cross-sectional view of the first FPC substrate 51 taken along the line VB-VB of FIG. 5A.

The first FPC substrate 51 is a board having excellent bendability, which is formed with a polyimide or polyester film as a base material. When being bent as indicated by the arrow F of FIG. 1, the first FPC substrate 51 has a surface S1 facing the case 2 and an opposing surface S2. When the first FPC substrate 51 is bent, S1 becomes an inner surface and S2 becomes an outer surface.

Figure 5B:
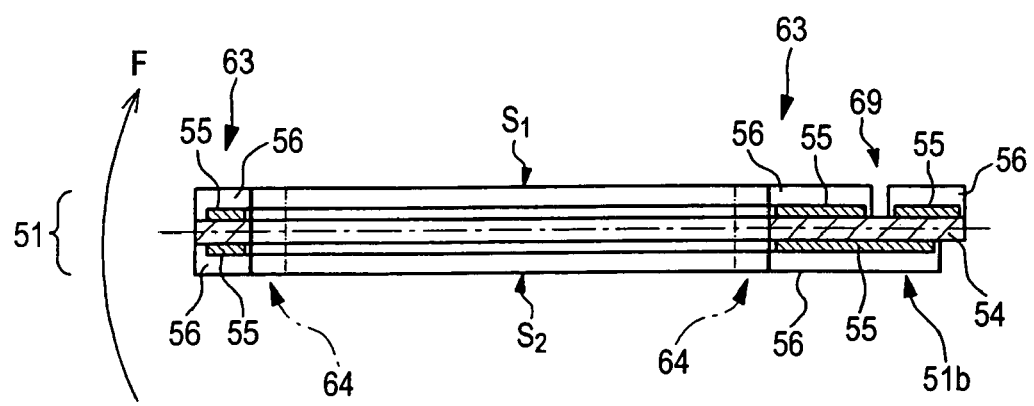
FIG. 5B is a side view illustrating the detailed structure of the first FPC substrate.

In the present embodiment, as shown in FIG. 5B, the first FPC substrate 51 has a structure in which a conductor 55 is formed on the surface of a base film 54 formed of polyimide or polyester, and a protective film 56 such as cover lay or resist is formed on the conductors 55. The conductor 55 and the protective film 56 are formed on both surfaces of the base film 54. That is, the first FPC substrate 51 of the present embodiment is a FPC substrate whose section has a two-layered wiring structure. Therefore, the conductors 55 are formed on the surface S1 and the surface S2, and, if necessary, the conductors 55 are electrically connected to each other via a through hole.

Figure 6A:
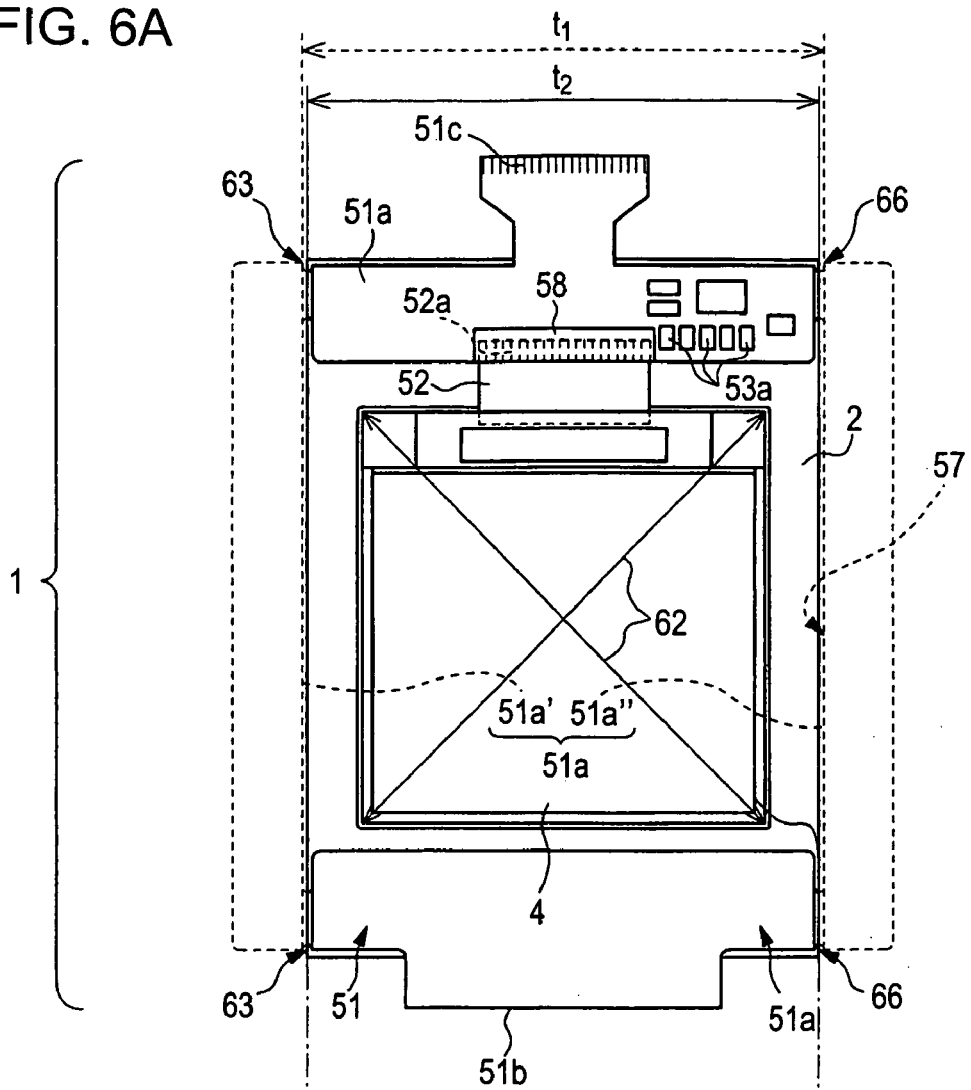
FIG. 6A is a plan view illustrating the mounted state of the first FPC substrate.

As shown in FIG. 5A, the first FPC substrate 51 has a circuit forming section 51a, a bent section 51b, input terminals 51c, output terminals 51d, and an LED substrate terminal 51e. The circuit forming section 51a is a region, which is indicated by oblique lines in FIG. 5A and in which electronic circuits and attendant wiring lines are formed. When the first FPC substrate 51 is bent as indicated by the arrow F of FIG. 1, as shown in FIG. 6A, the circuit forming section 51a is disposed around the second housing space 62 of the case 2. For this reason, the circuit forming section 51a is formed in a frame shape to surround an opening 57 of the second housing space 62 of the case 2 in plan view, as shown in FIG. 5A. As shown in FIG. 6A, the opening 57 is formed to have a width t1 substantially equal to or slightly larger than a width t2 between both side surfaces of the case 2. In the following description, one circuit forming section having the opening 57 sandwiched is referred to as a first circuit forming section 51a' and the other circuit forming section is referred to as a second circuit forming section 51a".

Referring to FIG. 5A, the first circuit forming section 51a' has a bent portion 63, such that the first circuit forming section 51a' can be bent at the bent portion 63. Further, at an end of the bent portion 63 close to the opening 57, a notch 64 is provided. As indicated by an arrow J1 in FIG. 6B, the first circuit forming section 51a' is bent downward in the drawing along a side surface 2c of the case 2. Next, the bent surface of the first circuit forming section 51a' is adhered to the side surface 2c of the case 2 by using an adhesive member 68, such as a double-sided tape or the like. Referring to FIG. 5B which shows the section of the bent portion 63 of the first circuit forming section 51a', the protective film 56 is drawn with no oblique line. That is, the protective film 56 is not provided in the bent portion 63. In the present embodiment, as shown in FIG. 5A, a region in which the protective film 56 is not formed is provided at the substantially same width as that of the notch 64.

As such, by forming the notch 64 at the end of the bent portion 63 of the first circuit forming section 51a' close to the opening 57, the position of the bent portion 63 can be accurately determined. Further, in the present embodiment, as described above, since the protective film 56 is not formed on the bent portion 63, the thickness of the board is thinned at the bent portion 63. In addition, rigidity of the corresponding portion can be lowered, and thus the first circuit forming section 51a' can be easily bent.

On the other hand, in FIG. 5A, the second circuit forming section 51a" has a bent portion 66, such that the second circuit forming section 51a" can be bent at the bent portion 66. Further, at an end of the bent portion 66 close to the opening 57, a notch 67 is provided. As indicated by an arrow J2 in FIG. 6B, the second circuit forming section 51a" is bent downward in the drawing along the side surface 2c of the case 2. Next, the bent surface of the second circuit forming section 51a" is adhered to the side surface 2c of the case 2 by using the adhesive member 68, such as a double-sided tape or the like.

As such, as shown in FIG. 5A, by providing the notch 67 at the end of the bent portion 66 of the second circuit forming section 51a" close to the opening 57, the position of the bent portion 66 can be accurately determined. Further, in the present embodiment, as for the bent portion 66, like the bent portion 63 of the first circuit forming section 51a', the protective film 56 is not formed. If doing so, the thickness of the board can be thinned at the bent portion 66. In addition, rigidity of the corresponding portion can be lowered, and thus the second circuit forming section 51a" can be easily bent.

The circuit forming section 51a is the portion in which electronic circuits or wiring lines are formed, but the first circuit forming section 51a' and the second circuit forming section 51a", which are parts of the circuit forming section 51a, can primarily function as elements for electrically connecting a circuit forming portion close to the input terminals 51c of the circuit forming section 51a and a circuit forming portion close to the output terminals 51d. Therefore, a structure in which wiring lines for connecting the input terminals 51c and the output terminals 51d are provided on the first circuit forming section 51a' and the second circuit forming section 51a" can be made. Further, on the first circuit forming section 51a' and the second circuit forming section 51a", electronic components, such as ICs or the like, can be mounted, in addition to the wiring lines.

Next, on the surface S2 of the circuit forming section 51a, on which the input terminals 51c are provided, that is, on the outer surface when being bent, a plurality of electronic components 35a are mounted. Further, similarly, on the surface S1 of the bent section 51b, that is, on the inner surface when being bent, a plurality of electronic components 35b are mounted. The electronic components 35a and 35b are provided to drive the first liquid crystal panel 3 and/or the second liquid crystal panel 4 shown in FIG. 1. For example, resistors, coils, capacitors, and power supply ICs can be exemplified. Further, on the outer surface S2 of the circuit forming section 51a on which the input terminals 51c are provided, the LED substrate terminal 51e is provided. To the LED substrate terminal 51e, the LED substrate 15 shown in FIG. 1 is connected, for example, by soldering. In addition, on the front and back surfaces of the circuit forming section 51a of FIG. 5A, a plurality of wiring lines, which connect the electronic components 35a and 35b or the terminals so as to constitute a circuit, are formed by patterning.

Next, the bent section 51b is a portion which is bent when the first FPC substrate 51 is bent as indicated by the arrow F of FIG. 1. As shown in FIG. 5B, on the inner surface S1 of the bent section 51b, a protective-film unformed section 69 in which the protective film 56 is not formed is provided. The protective-film unformed section 69 is provided to extend straight in a direction perpendicular to the paper in FIG. 5B. Accordingly, the thickness of the bent section 51b is thinned, and thus bending is easily performed. In the present embodiment, one protective-film unformed section 69 is provided. However, a plurality of protective-film unformed sections 69 may be provided. Further, in the present embodiment, the protective-film unformed section 69 is provided on the inner surface S1 when the circuit forming section 51a is bent. Alternatively, the protective-film unformed section 69 may be formed on the outer surface S2 when the circuit forming section 51a is bent.

Next, referring to FIG. 5A, the input terminals 51c are provided to protrude to the end side opposite to the bent section 51b of the circuit forming section 51a. To the input terminals 51c, an external input apparatus (for example, a control circuit of an electronic apparatus, such as a cellular phone or the like) or an external power supply is connected. Further, as shown in FIG. 1, the output terminals 51d are connected onto the extended section 24 of the first liquid crystal panel 3, for example, by using an ACF. Signals transmitted to the output terminals 51d are transmitted to the driving IC 26 through external connecting terminals of the first liquid crystal panel 3.

Further, referring to FIG. 5A, on the outer surface S2 of the circuit forming section 51a, a connector 58 is provided in the vicinity of the input terminals 51c. To the connector 58, input terminals 52a (described below) of the second FPC substrate 52 shown in FIG. 1 are connected. Moreover, on the first FPC substrate 51, instead of the connector 58, terminals may be provided. In this case, the terminals and the input terminals 52a of the second FPC substrate 52 can be correspondingly connected to each other, for example, by soldering.

Next, referring to FIG. 1, to the side end of the extended section 34 of the first transmissive substrate 31 of the second liquid crystal panel 4, the second FPC substrate 52 serving as the flexible wiring substrate is connected, for example, by using an ACF. Like the first FPC substrate 51, the second FPC substrate 52 is formed with a polyimide or polyester film as a base material.

On the second FPC substrate 52, the input terminals 52a are formed. The input terminals 52a are connected to the connector 58 provided on the first FPC substrate 51. Accordingly, through the first FPC substrate 51 and the second FPC substrate 52, the first liquid crystal panel 3 and the second liquid crystal panel 4 are electrically connected to each other. And then, signals or power for driving the first liquid crystal panel 3 and the second liquid crystal panel 4 are supplied from the input apparatus or the external power supply through the second FPC substrate 52 and the first FPC substrate 51.

By the way, in the liquid crystal display device 1 having the configuration shown in FIG. 1, when the first FPC substrate 51 is bent as indicated by the arrow F, it is necessary to dispose the first FPC substrate 51 at a position where display of the second liquid crystal panel 4 is not disturbed. However, in the related art, if a liquid crystal display device is reduced in size, it is difficult to ensure enough area to dispose the FPC substrate in a region of the case 2 of the liquid crystal display device. For this reason, the FPC substrate cannot extend to the outside of the case to be installed, and thus it is difficult to reduce the size of the entire liquid crystal display device.

Figure 6B:
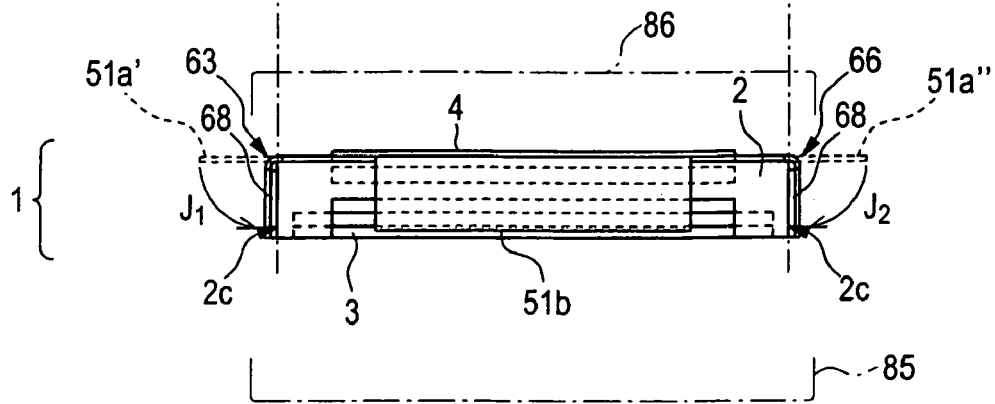
FIG. 6B is a side view illustrating the mounted state of the first FPC substrate.

In contrast, in the present embodiment, as shown in FIG. 6B, the first circuit forming section 51a' is bent at the bent portion 63 in the direction of the arrow J1 such that its surface faces the side surface 2c of the case 2. Further, similarly, the second circuit forming section 51a" is bent at the bent portion 66 in the direction of the arrow J2 such that its surface faces the side surface 2c of the case 2. If parts of the circuit forming section 51a of the first FPC substrate 51 are disposed on the side surfaces 2c of the case 2 in such a manner, even when the case 2 is formed small to reduce the size of the liquid crystal display device 1, a large area of the circuit forming section 51a of the first FPC substrate 51 can be ensured. For this reason, the liquid crystal display device 1 having the first FPC substrate 51 can be reduced in size. On the contrary, by making the substantial area of the first FPC substrate 51 large, a large circuit can be formed on the circuit forming section 51a of the first FPC substrate 51.

Next, a method of mounting the first FPC substrate 51 serving as the wiring substrate on the first liquid crystal panel 3 of the liquid crystal display device 1 shown in FIG. 1 and mounting them on the case 2 will be described with reference to FIG. 7. First, in a process P1 of FIG. 7, the first FPC substrate 51 is connected to the first liquid crystal panel 3 shown in FIG. 1. At this time, the output terminals 51d of the first FPC substrate 51 shown in FIG. 5A are electrically connected to the external connecting terminals (not shown) formed in the extended section 24 of the first liquid crystal panel 3 shown in FIG. 1 by using the ACF.

Figure 7:
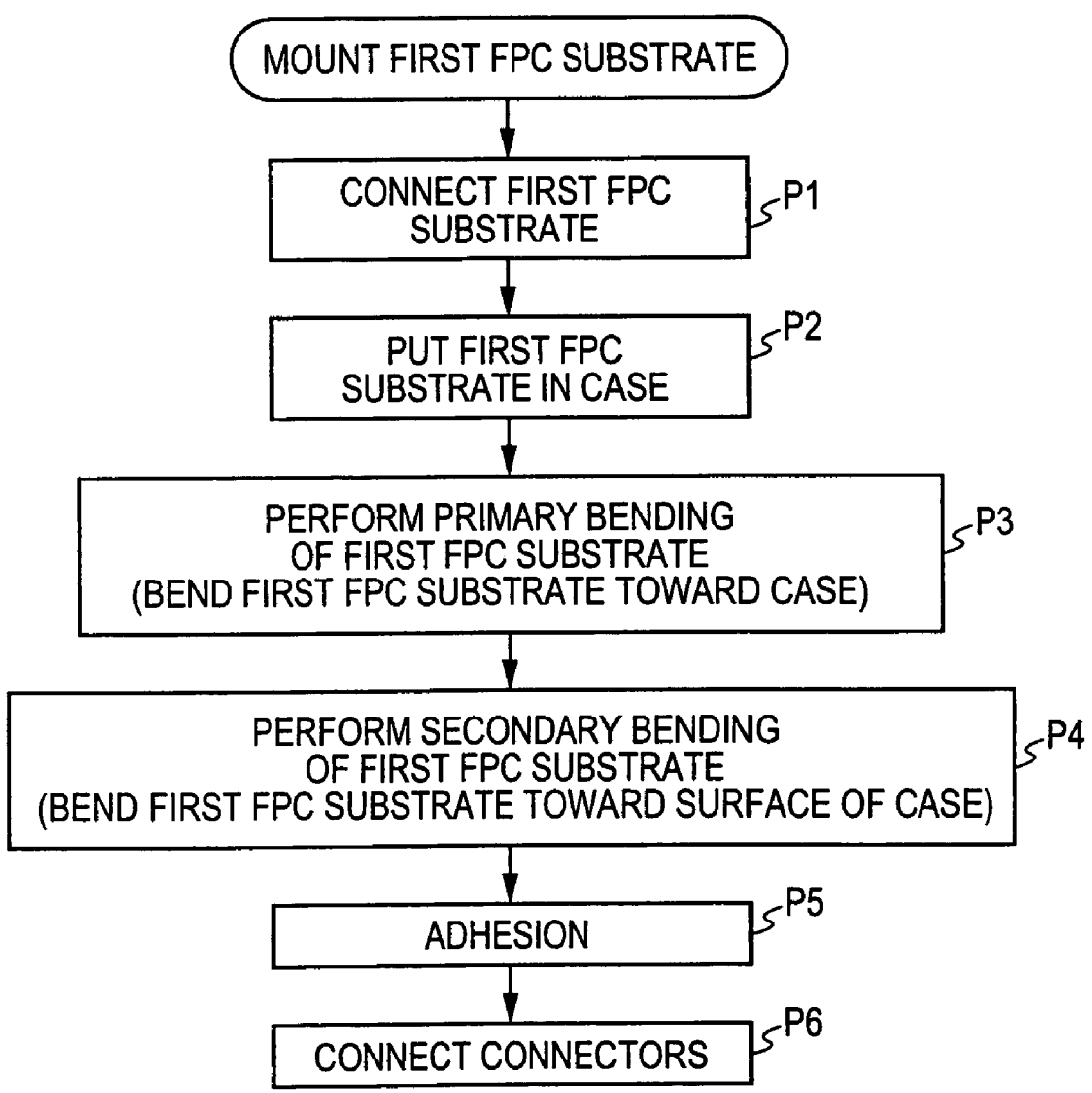
FIG. 7 is a flow chart illustrating an embodiment of a method of mounting the wiring substrate according to the invention.

Next, in a process P2 of FIG. 7, as shown in FIG. 2, the first liquid crystal panel 3 and the first illumination device 5 are housed in the first housing space 61 of the case 2. Further, similarly, the second liquid crystal panel 4 and the second illumination device 6 are housed in the second housing space 62 of the case 2. Next, in a process P3 of FIG. 7, a primary bending process of the first FPC substrate 51 for assembling the liquid crystal display device 1 is executed. Specifically, at the bent section 51b of the first FPC substrate 51 shown in FIG. 1, the first FPC substrate 51 is bent as indicated by the arrow F. At this time, the first FPC substrate 51 is bent to surround one side of the case 2 and is disposed on the second surface 2b of the case 2 opposite to the display surface C of the first liquid crystal panel 3.

Next, in a process P4 of FIG. 7, a secondary bending process for housing the first FPC substrate 51 in the region of the case 2 as viewed in plan view is executed. Specifically, the first circuit forming section 51a' shown in FIG. 5A is bent to the back side of FIG. 5A along the bent portion 63. At this time, the first circuit forming section 51a' is bent in the direction indicated by the arrow J1 in FIG. 6B, such that its surface faces the side surface 2c of the case 2. Further, similarly, the second circuit forming section 51a" shown in FIG. 5A is bent to the back side of FIG. 5A along the bent portion 66. At this time, the second circuit forming section 51a" is bent in the direction indicated by the arrow J2 in FIG. 6B, such that its surface faces the side surface 2c of the case 2.

Next, in a process P5 of FIG. 7, as shown in FIG. 6B, the first circuit forming section 51a' and the second circuit forming section 51a" of the first FPC substrate 51 are adhered to the side surface 2c of the case 2, for example, by using the adhesive member 68 or the like.

Next, in a process P6 of FIG. 7, as shown in FIG. 6A, the input terminals 52a of the second FPC substrate 52 are inserted into the connector 58 of the first FPC substrate 51. Accordingly, the first liquid crystal panel 3 and the second liquid crystal panel 4 shown in FIG. 1 are electrically connected to each other through the first FPC substrate 51 and the second FPC substrate 52. In such a manner, the first FPC substrate 51 is mounted on the first liquid crystal panel 3 included in the liquid crystal display device 1, and thus the liquid crystal display device 1 is realized.

As described above, in a method of mounting a wiring substrate according to the present embodiment, in the process P4 of FIG. 7, as shown in FIG. 6B, the first circuit forming section 51a' is bent at the bent portion 63 in the direction of the arrow J1 such that its surface faces the side surface 2c of the case 2. Further, similarly, the second circuit forming section 51a" is bent at the bent portion 66 in the direction of the arrow J2 such that its surface faces the side surface 2c of the case 2. If parts of the circuit forming section 51a of the first FPC substrate 51 are disposed on the side surfaces 2c of the case 2 in such a manner, even when the case 2 is formed small to reduce the size of the liquid crystal display device 1, the large area of the circuit forming section 51a of the first FPC substrate 51 can be ensured. For this reason, the liquid crystal display device 1 having the first FPC substrate 51 can be reduced in size. Further, on the contrary, by making the substantial area of the first FPC substrate 51 large, a large circuit can be formed on the circuit forming section 51a of the first FPC substrate 51.

Second Embodiment of Electro-Optical Device

Next, another embodiment of the electro-optical device according to the invention will be described. The description of the present embodiment will also be given by way of the liquid crystal display device.

Figure 8:
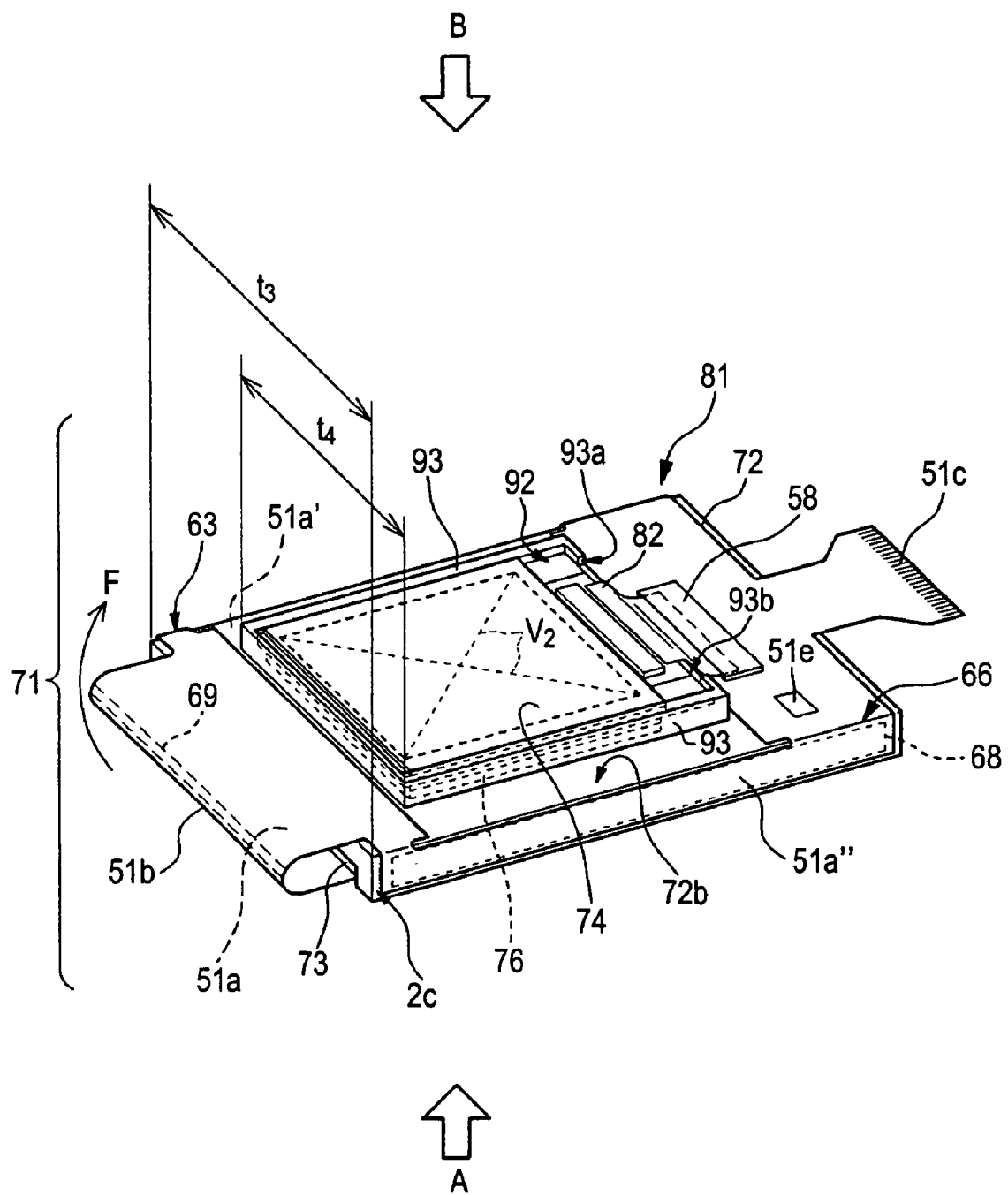
FIG. 8 is a perspective view illustrating another embodiment of the electro-optical device according to the invention.

FIG. 8 shows a liquid crystal display device 71 which is another embodiment of the electro-optical device according to the invention. A difference between the present embodiment and the first embodiment is as follows. In the first embodiment, as shown in FIG. 1, the second housing space 92 is the space formed inside the case 2, and is provided in the second surface 2b (that is, the surface on which the second liquid crystal panel 74 is mounted) of the case 2, on which the arrow B is drawn. In contrast, in the present embodiment, as shown in FIG. 8, on a surface of a case 72, on which an arrow B is drawn, that is, on a second surface 72b, a frame section 93 protruding from the second surface 72b is formed and a second housing space 92 is formed inside of the frame section 93. Hereinafter, the liquid crystal display device 71 of FIG. 8 will be described, paying emphasis on the difference from the liquid crystal display device 1 of FIG. 1.

In the liquid crystal display device 71 of FIG. 8, a first FPC substrate 81 can have the same configuration as that of the first FPC substrate 51 shown in FIGS. 5A and 5B. In the present embodiment, it is assumed that the first FPC substrate 81 having the same configuration as that of the first FPC substrate 51 is used. Further, in FIG. 8, a second FPC substrate 82, a first liquid crystal panel 73, a second liquid crystal panel 74, and a second illumination device 76 can individually have the same configurations as those of the second FPC substrate 52, the first liquid crystal panel 3, the second liquid crystal panel 4, and the second illumination device 6 shown in FIG. 1. In the present embodiment, it is assumed that the second FPC substrate 82, the first liquid crystal panel 73, the second liquid crystal panel 74, and the second illumination device 76 individually have the same configurations as those of the second FPC substrate 52, the first liquid crystal panel 3, the second liquid crystal panel 4, and the second illumination device 6. Moreover, the same parts as those shown in FIGS. 5A and 5B are represented by the same reference numerals.

Referring to FIG. 8, the second liquid crystal panel 74 and the second illumination device 76 are housed in the second housing space 92. The second housing space 92 is formed to a height substantially equal to a total thickness of the second liquid crystal panel 74 and the second illumination device 76. Further, a distance t4 between opposing sides in the frame section 93 forming the second housing space 92 is set smaller than a width t3 between both side surfaces of the case 72.

In one side of the frame section 93, in which the second FPC substrate 82 is provided, an open section 93a, which is a surface having a height lower than a remaining protruding section but higher than or equal to the second surface 72b, is formed. The open section 93a has a shape obtained by cutting and opening one side of the frame section 93 forming the second housing space 92. Further, the open section 93a is formed to have a width equal to or larger than the width of the second FPC substrate 82 so as to extend the second FPC substrate 82 to the outside. In addition, the open section 93a is preferably formed to have such a height that, when the second liquid crystal panel 74 and the second illumination device 76 are housed in the second housing space 92, a bottom surface 93b of the open section 93a does not come into contact with the second FPC substrate 82. Accordingly, when the second liquid crystal panel 74 and the second illumination device 76 are housed in the second housing space 92, the second FPC substrate 82 can extend straight outside the second housing space 92 through the open section 93a.

A second circuit forming section 51a" of the first FPC substrate 81 is bent at a bent portion 66 downward in the drawing such that its surface faces a side surface 2c of the case 72. And then, the bent second circuit forming section 51a" is adhered to the side surface 2c of the case 72, for example, by using an adhesive member 68, such as a double-sided tape or the like. Moreover, though not shown, a first circuit forming section 51a' on the other side of the first FPC substrate 81 is bent at a bent portion 63 such that its surface faces the side surface 2c of the case 72 and is adhered to the side surface 2c of the case 72.

According to the embodiment of FIG. 8, at the bent portions 63 and 66, the first circuit forming section 51a' and the second circuit forming section 51a" of the first FPC substrate 81 are bent downward in the drawing such that their surfaces face the side surfaces 2c of the case 72. If parts of the circuit forming section 51a of the first FPC substrate 81 are disposed on the side surface 2c of the case 72 in such a manner, even when the case 72 is formed small to reduce the size of the liquid crystal display device 71, a large area of the circuit forming section 51a of the first FPC substrate 81 can be ensured. For this reason, the liquid crystal display device 71 having the first FPC substrate 81 can be reduced in size. Further, on the contrary, by making the substantial area of the first FPC substrate 81 large, a large circuit can be formed on the circuit forming section 51a of the first FPC substrate 81.

Third Embodiment of Electro-Optical Device

Next, still another embodiment of the electro-optical device according to the invention will be described. The description of the present embodiment will be also given by way of the liquid crystal display device. The same reference numerals as those in the first embodiment and the second embodiment represent the same parts.

Figure 9:
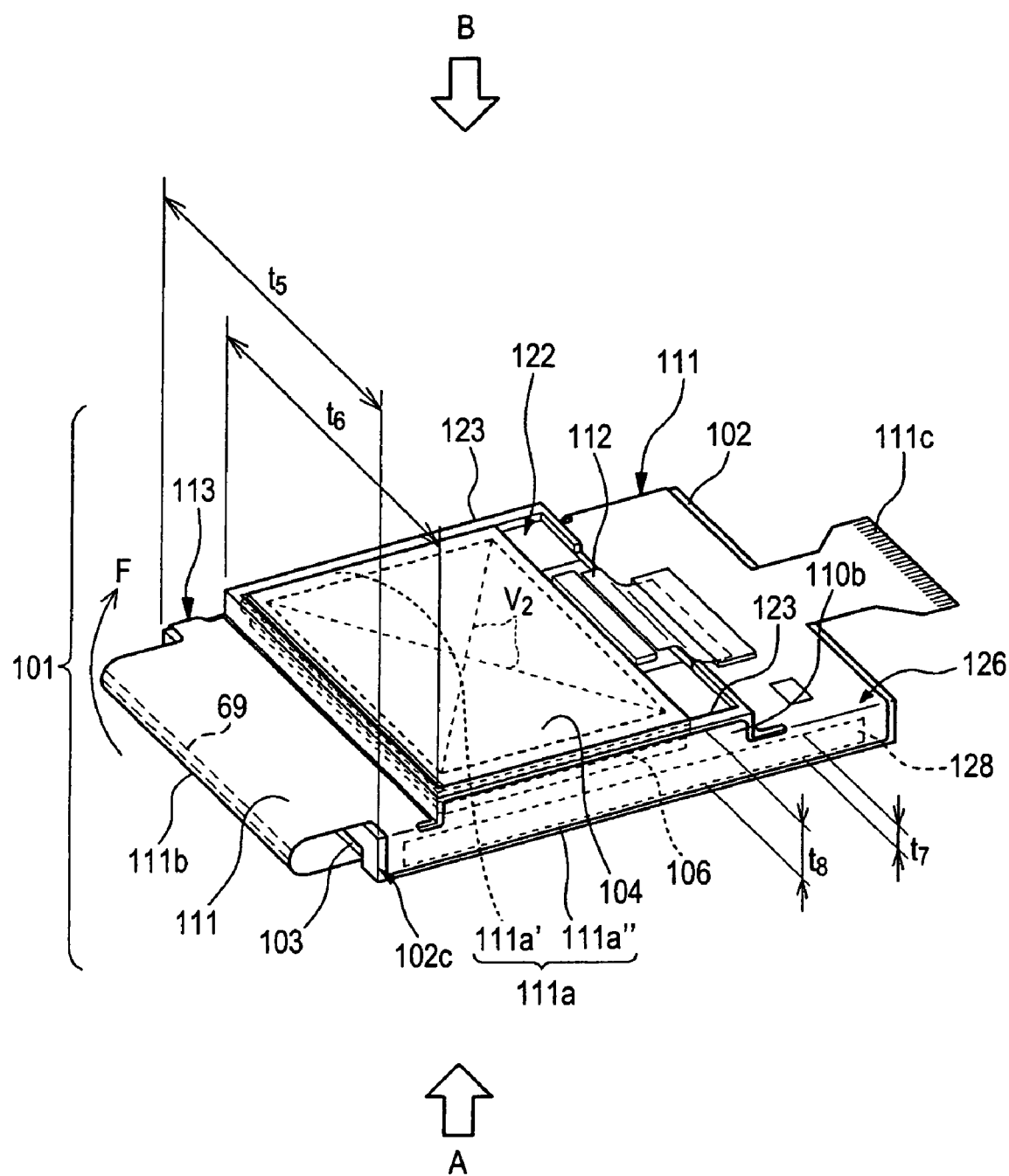
FIG. 9 is a perspective view illustrating still another embodiment of the electro-optical device according to the invention.
Figure 10:
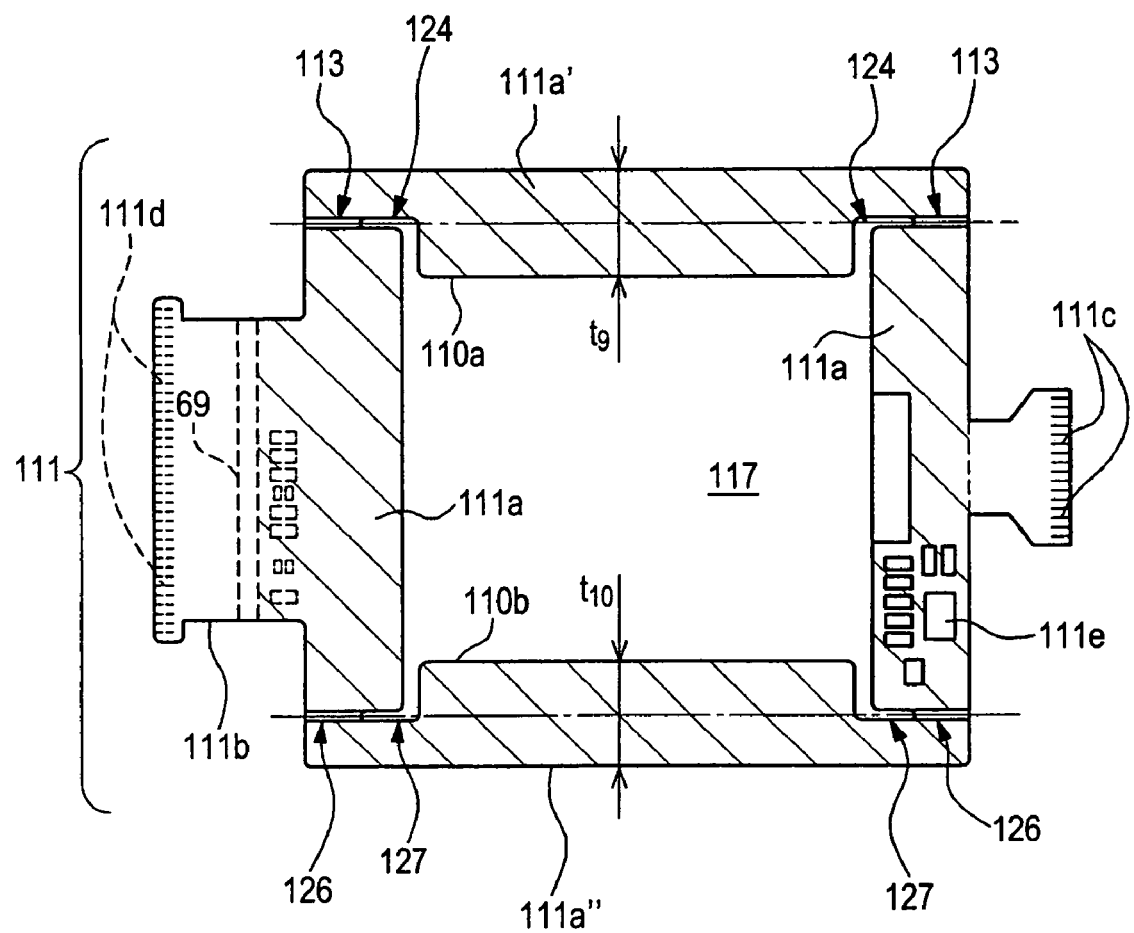
FIG. 10 is a plan view illustrating the detailed structure of a first FPC substrate which is another embodiment of the wiring substrate.

FIG. 9 shows a liquid crystal display device 101 which is still another embodiment of the electro-optical device according to the invention. Further, FIG. 10 is a diagram of a first FPC substrate 111 of FIG. 9 as viewed from a direction of an arrow B in plan view. Moreover, a bent section 111b is shown in an exploded state. In addition, FIG. 10 is a diagram corresponding to FIG. 5A. In FIG. 10, however, the first FPC substrate 111 is in a state in which the first FPC substrate 51 of FIG. 5A is rotated by 180° in plane. This is to align FIG. 10 with the state shown in FIG. 9.

In the second embodiment described above, as shown in FIG. 8, the frame section 93 protruding from the second surface 72b is formed in the second surface 72b of the case 72, and the distance t4 between the opposing sides of the frame section 93 is set smaller than the width t3 of the case 72. In contrast, in the present embodiment, as shown in FIG. 9, a distance t6 between opposing sides of a frame section 123 is set equal to a width t5 of a case 102. Hereinafter, the liquid crystal display device 101 of FIG. 9 will be described, paying emphasis on the difference from the liquid crystal display device 71 of FIG. 8.

In the liquid crystal display device 101 of FIG. 9, a second FPC substrate 112, a first liquid crystal panel 103, a second liquid crystal panel 104, and a second illumination device 106 individually have the same configurations as those of the second FPC substrate 82, the first liquid crystal panel 73, the second liquid crystal panel 74, and the second illumination device 76 shown in FIG. 8. In the present embodiment, it is assumed that the second FPC substrate 112, the first liquid crystal panel 103, the second liquid crystal panel 104, and the second illumination device 106 individually have the same configurations as those of the second FPC substrate 82, the first liquid crystal panel 73, the second liquid crystal panel 74, and the second illumination device 76. Further, the case 102 of FIG. 9 can have the same structure as that of the case 72 of FIG. 8, excluding the shape of a frame section. In the present embodiment, it is assumed that the case 102 has the same configuration as that of the case 72. Further, the first FPC substrate 111 has the same structure as that of the first FPC substrate 81 shown in FIG. 8, that is, the first FPC substrate 51 shown in FIGS. 5A and 5B, excluding the shape of a circuit forming section, in particular, the shapes of a first circuit forming section 51a' and a second circuit forming section 51a". Moreover, in FIGS. 9 and 10, reference numeral 111b denotes a bent section of the first FPC substrate 111, reference numeral 111c denotes input terminals, reference numeral 111d denotes output terminals, and reference numeral 69 denotes a protective-film unformed section.

First, referring to FIG. 9, the distance t6 between the opposing sides of the frame section 123 is set equal to the width t5 between both side surfaces of the case 102. That is, side surfaces 102c of the case 102 include the side surfaces of the frame section 123. Therefore, a height t8 of the side surface 102c of the case 102 in a region where the frame section 123 is formed is set higher than a height t7 of the side surface 102c of the case 102 in other regions.

Next, in the first FPC substrate 111, as shown in FIG. 10, a first circuit forming section 111a' protrudes inside an opening 117, such that a protruding section 110a is provided. A width t9 of the first circuit forming section 111a' including the protruding section 110a is set equal to or slightly smaller than the height t8 of a corresponding portion of the side surface 102c of the case 102 shown in FIG. 9.

Further, in a second circuit forming section 111a" which faces the first circuit forming section 111a' across the opening 117 of FIG. 10, a protruding section 110b having a shape protruding inside the opening 117 is provided. A width t10 of the second circuit forming section 111a" including the protruding section 110b is set equal to or slightly smaller than the width t8 of the corresponding portion of the side surface 102c of the case 102 shown in FIG. 9.

As shown in FIG. 9, the first FPC substrate 111 having the above-described configuration is connected to the first liquid crystal panel 103 provided in the liquid crystal display device 101. At this time, the second circuit forming section 111a" of the first FPC substrate 111 is bent downward in the drawing at a bent portion 126 along the side surface 102c of the case 102. Further, the protruding section 110b of the second circuit forming section 111a" is disposed on the side surface of the frame section 123 in a state in which the entire second circuit forming section 111a" is bent and lifted upward. And then, the second circuit forming section 111a" is adhered to the side surface 102c of the case 102, for example, by using an adhesive member 128, such as a double-sided tape or the like. Moreover, although the first circuit forming section 111a' and the protruding section 110a of FIG. 10 are not shown in FIG. 9, like the second circuit forming section 111a", the first circuit forming section 111a' and the protruding section 110a are bent along the side surfaces 102c and are adhered to the side surface 102c.

According to the embodiment of FIG. 9, the first circuit forming section 111a' and the second circuit forming section 111a", which are parts of the circuit forming section 111a of the first circuit forming board 111, are bent downward in the drawing so as to face the side surfaces 102c of the case 102. If the parts of the circuit forming section 111a of the first FPC substrate 111 are disposed on the side surfaces 102c of the case 102, even when the case 102 is formed small so as to reduce the size of the liquid crystal display device 101, a large area of the circuit forming section 111a of the first FPC substrate 111 can be ensured. For this reason, the liquid crystal display device 101 having the first FPC substrate 111 can be reduced in size. Further, on the contrary, by making the substantial area of the first FPC substrate 111 large, a large circuit can be formed on the circuit forming section 111a of the first FPC substrate 111.

Further, as for the case 102, the distance t6 between the opposing sides of the frame section 123 is set equal to the width t5 of the case 102. Accordingly, the side surfaces 102c of the case 102 include the side surfaces of the frame section 123, and thus the areas of the side surfaces 102c can be widened. As a result, on both the side surfaces 102c of the case 102, the first circuit forming section 111a' provided with the protruding section 110a and the second circuit forming section 111a" provided with the protruding section 110b shown in FIG. 10 can be individually disposed. The first circuit forming section 111a' and the second circuit forming section 111a" are individually provided with the protruding section 110a and the protruding section 110b, and thus an area for forming a circuit can be widened. Therefore, a large circuit can be formed.

Fourth Embodiment of Electro-Optical Device

Next, an electro-optical device according to a fourth embodiment of the invention will be described. Also, the present embodiment illustrates a liquid crystal display device. In the fourth embodiment, the same reference numerals as the first to third embodiments are denoted by the same reference numerals, and the description thereof will be omitted.

Figure 11:
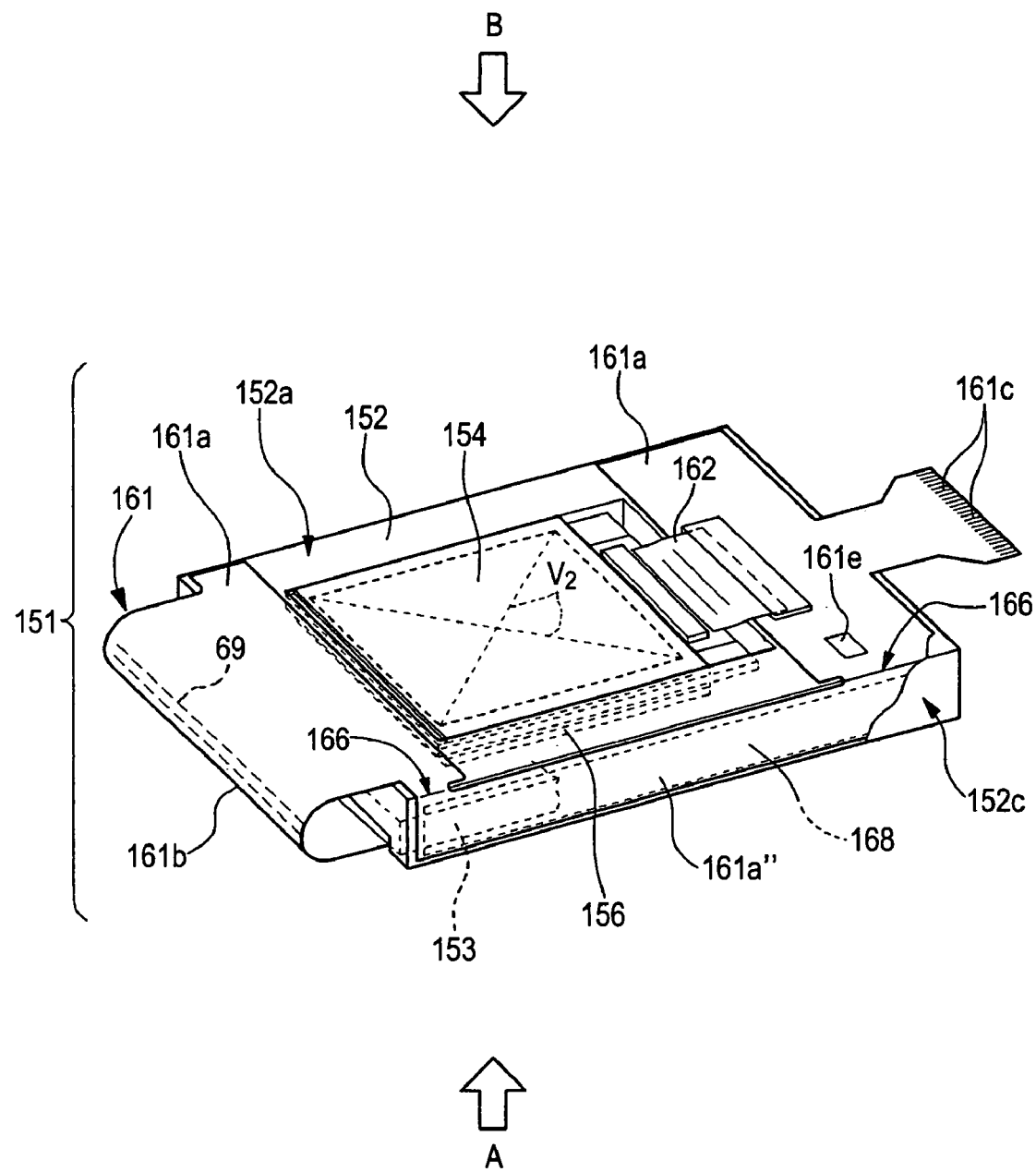
FIG. 11 is a perspective view illustrating yet another embodiment of the electro-optical device according to the invention.
Figure 12:
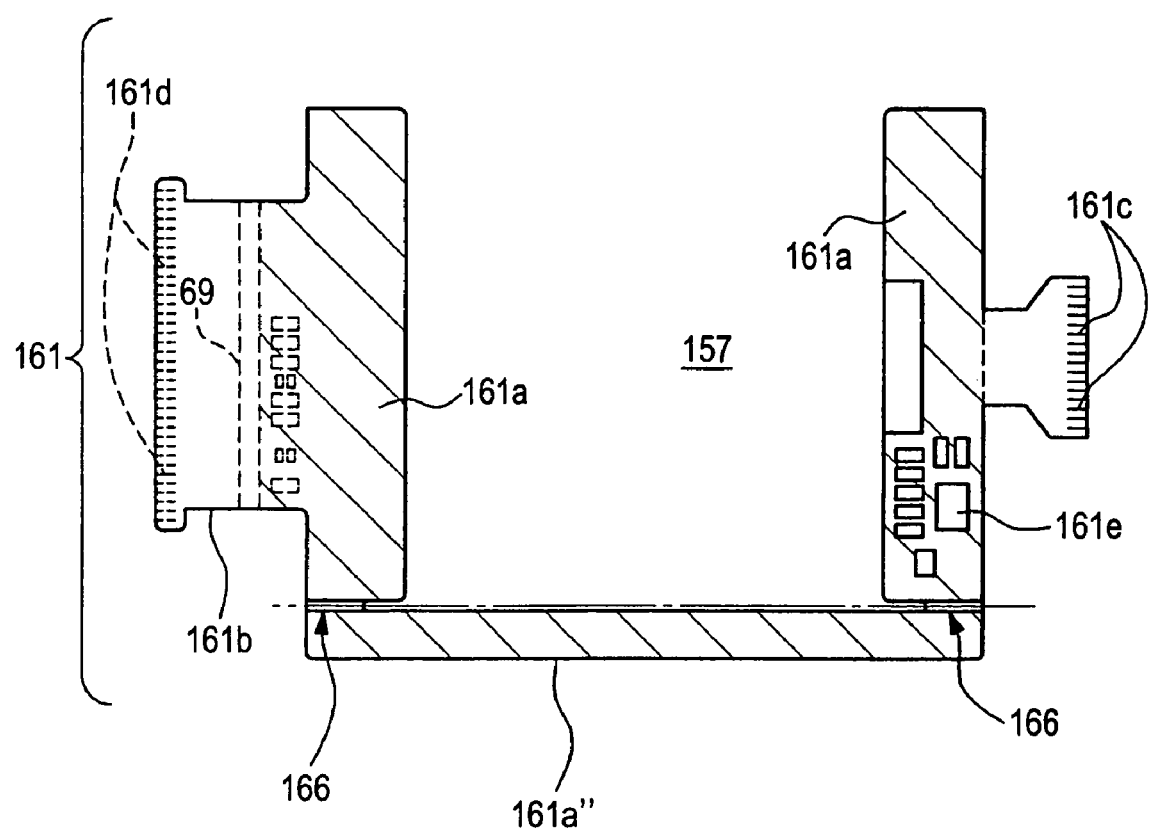
FIG. 12 is a plan view illustrating the detailed structure of a first FPC substrate which is still another embodiment of the wiring substrate.

FIG. 11 illustrates a liquid crystal display device 151 according to the fourth embodiment of the invention. FIG. 12 is a plan view of a first FPC substrate 161 of FIG. 11 viewed from an arrow direction B. In FIG. 12, a bent portion 161b is shown in an exploded state. Further, FIG. 12 corresponds to FIG. 5A, but is different from FIG. 5A in that the first FPC substrate 161 enters a state where the first FPC substrate 51 of FIG. 5A rotates in a plane by 180°. This is for FIG. 12 to enter a state shown in FIG. 11.

As shown in FIG. 5A, in the first embodiment, the circuit forming section 51a of the first FPC substrate 51 is formed in a frame shape with the opening 57, and a circuit forming section on the side of the input terminals 51c and a circuit forming section on the side of the output terminals 51d are provided at both sides of FIG. 5A with the opening 57 interposed therebetween. At upper and lower ends of FIG. 5A, a first circuit forming section 51a' and a second circuit forming section 51a" are provided so as to connect them to each other. In addition, as shown in FIG. 6B, each of the first circuit forming section 51a' and the second circuit forming section 51a" is bent such that each surface is opposite to the side surface 2c of the case 2.

In contrast, in the fourth embodiment, as shown in FIG. 12, the circuit forming section 161a of the first FPC substrate 161 is formed in a substantially U shape so as to surround the FPC substrate opening 157. The second circuit forming section 161a" is provided at a portion of the U shape opposite to the opening portion. In FIG. 11, the second circuit forming section 161a" is bent so as to be opposite to one side surface 152c of the case 152. Hereinafter, the difference between the liquid crystal display device 151 of FIG. 11 and the liquid crystal display device 1 of FIG. 6 will be mainly described.

In the liquid crystal display device 151 of FIG. 11, each of a second FPC substrate 162, a first liquid crystal panel 153, a second liquid crystal panel 154, and a second illumination device 156 can have the same structure as each of the second FPC substrate 52, the first liquid crystal panel 3, the second liquid crystal panel 4, and the second illumination device 6, and in the present embodiment, it is assumed that each of them has the same structure as each of them shown in FIG. 1. In addition, the first FPC substrate 161 of FIG. 12 can have the same structure as the first FPC substrate 51 shown in FIG. 5, except for the shape of the circuit forming section. In the present embodiment, it is assumed that the first FPC substrate 161 of FIG. 12 has the same structure as the first FPC substrate 51 shown in FIG. 5.

In FIG. 12, the first FPC substrate 161 includes the circuit forming section 161a, a bent unit 161b, input terminals 161c, output terminals 161d, and an LED substrate terminal 161e. The circuit forming section 161a is a region which is indicated by oblique lines in FIG. 12. As shown in FIG. 11, the first FPC substrate 161 is connected to the first liquid crystal panel 153 which is disposed on the side shown by an arrow A. Further, the first FPC substrate 161 is bent so as to wind up an end side of the case 152 in the bent portion 161b, and is disposed on the side shown by an arrow B, that is, on the second surface 152b of the case 152.

In FIG. 12, the circuit forming section 161a of the first FPC substrate 161 is formed in a substantially U shape so as to surround the FPC substrate opening 157 in plan view. A portion of the circuit forming section 161a opposite to the portion opened by the FPC substrate opening 157 corresponds to the second circuit forming section 161a". As shown in FIG. 11, the second circuit forming section 161a" is bent downward in the drawing such that its surface is opposite to one side surface 152c of the case 152 at the bent portion 166. In addition, the bent second circuit forming section 161a" is adhered to the side surface 152c of the case 152, for example, by using an adhesive member 168, such as a double-sided tape or the like.

According to the fourth embodiment of FIG. 11, in the bent portion 166, the second circuit forming section 161a", which is the part of the circuit forming section 161a of the first FPC substrate 161, is bent downward such that its surface is opposite to one side surface 152c of the case 152. As such, if the second circuit forming section 161a" is disposed on the side surface 152c of the case 152, even though the case 152 is formed small so as to reduce the size of the liquid crystal display device 151, a large area of the circuit forming section 161a of the first FPC substrate 161 can be ensured. Therefore, the liquid crystal display device 151 having the first FPC substrate 161 can be formed so as to have a small size. In addition, a substantial area of the first FPC substrate 161 can be increased, so that a large-sized circuit can be formed on the circuit forming section 161a of the first FPC substrate 161.

Fifth Embodiment of Electro-Optical Device

Next, an electro-optical device according to a fourth embodiment of the invention will be described. Also, the present embodiment illustrates a liquid crystal display device. In the fifth embodiment, the same reference numerals as the first to fourth embodiments are denoted by the same reference numerals, and the description thereof will be omitted.

Figure 13:
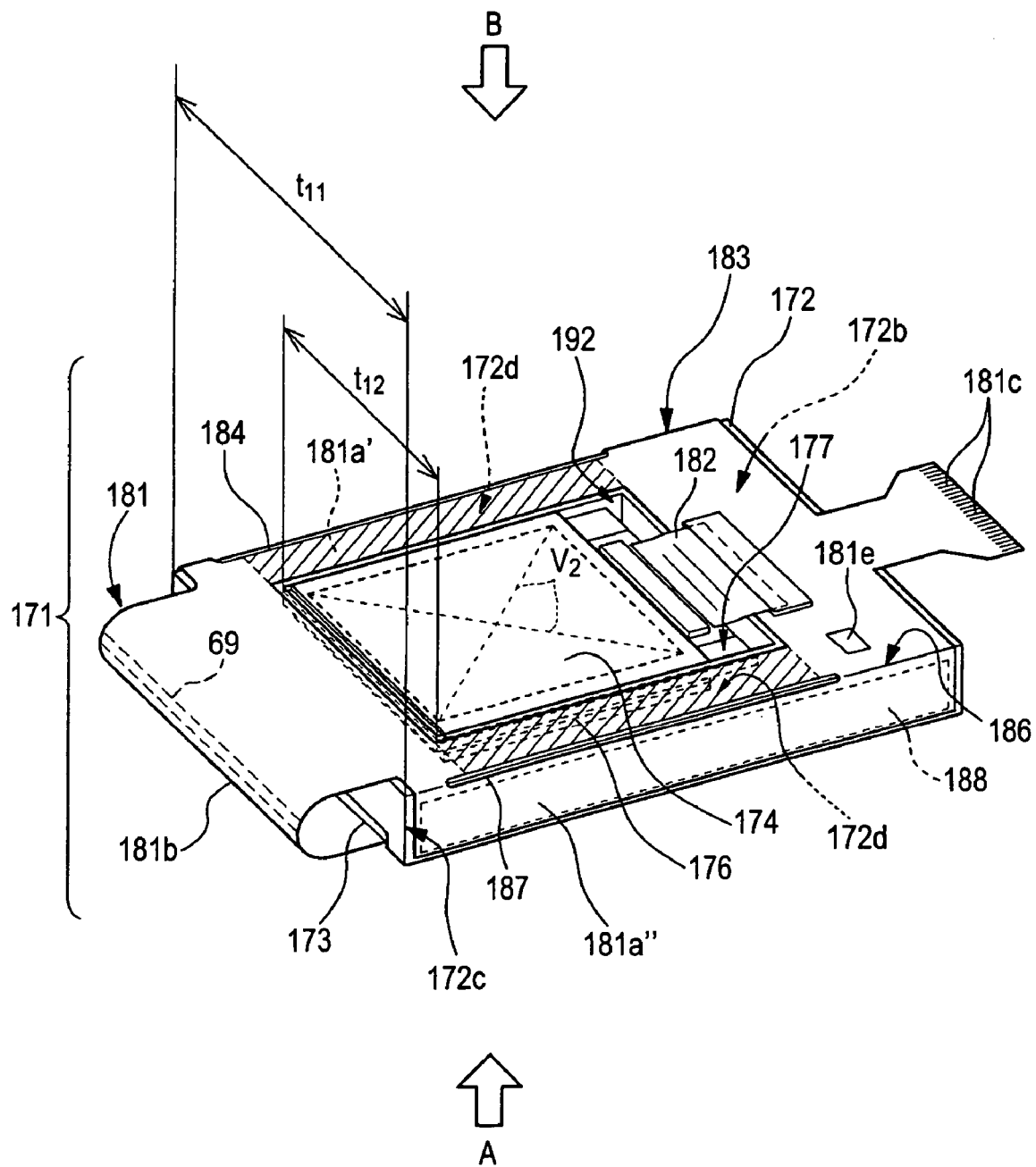
FIG. 13 is a perspective view illustrating still yet another embodiment of the electro-optical device according to the invention.
Figure 14:
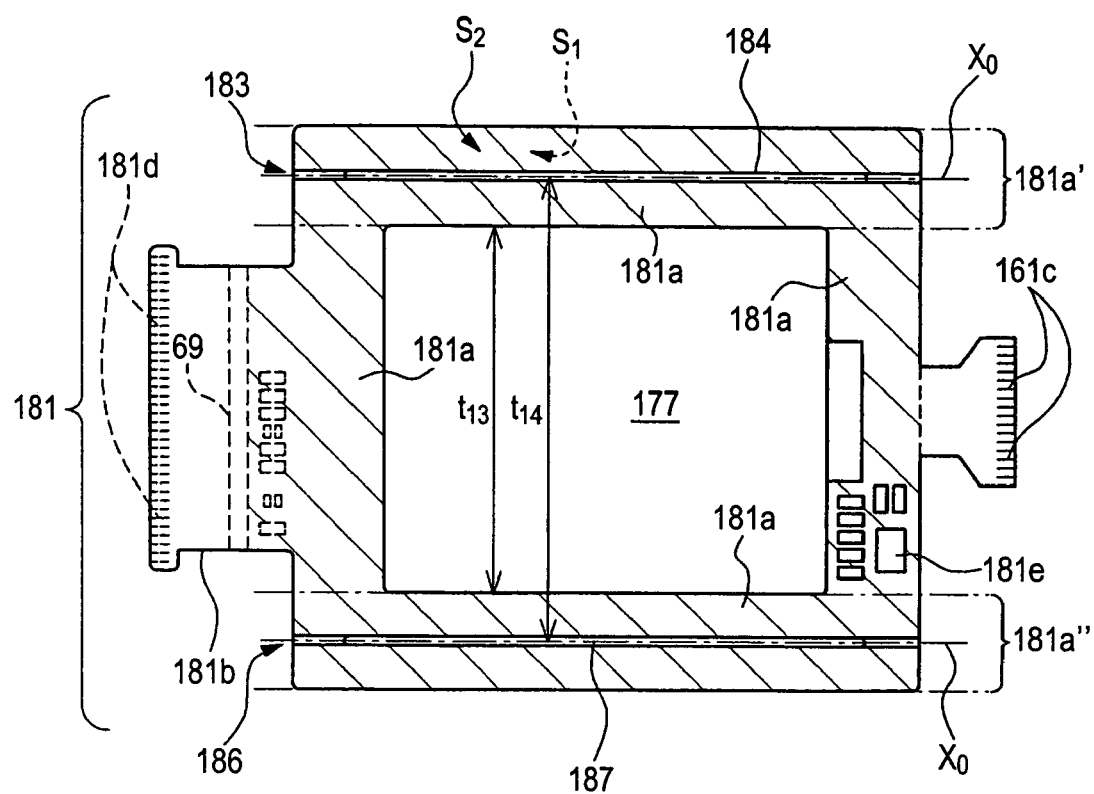
FIG. 14 is a plan view illustrating the detailed structure of a first FPC substrate which is yet another embodiment of the wiring substrate.

FIG. 13 illustrates a liquid crystal display device 171 according to the fifth embodiment of the invention. FIG. 14 is a plan view of a first FPC substrate 181 of FIG. 13 viewed from an arrow direction B. In FIG. 14, a bent portion 181b is shown in an exploded state. In the first embodiment illustrated in FIG. 6, the first FPC substrate 51 is provided such that the inner surface S1 of each of the first forming unit 51a' and the second circuit forming section 51a" is opposite to the side surface 2c of the case 2. In the present embodiment, as shown in FIG. 13, a first circuit forming section 181a' and a second circuit forming section 181a" are respectively formed on a planar region 172d between the second liquid crystal panel 174 and the side surface 172c (region indicated by oblique lines) on the second surface 172b of the case 172 as well as the side surface 172c. Hereinafter, the difference between the liquid crystal display device 171 of FIG. 13 and the liquid crystal display device 1 of FIG. 6 will be mainly described.

In the liquid crystal display device 171 of FIG. 13, each of a case 172, a second FPC substrate 182, a first liquid crystal panel 173, a second liquid crystal panel 174, and the second illumination device 176 can have the same structure as each of the case 2, the second FPC substrate 52, the first liquid crystal panel 3, the second liquid crystal panel 4, and the second illumination device 6 shown in FIG. 1. In the present embodiment, it is assumed that each of the above has the same structure as each of them shown in FIG. 1. In addition, a first FPC substrate 181 of FIG. 14 can have the same structure as the first FPC substrate 51 shown in FIG. 5, except for the shape of the circuit forming section. In the present embodiment, it is assumed that the first FPC substrate 181 of FIG. 14 has the same structure as the first FPC substrate 51 shown in FIG. 5, except for the shape of the circuit forming section.

In FIG. 14, the first FPC substrate 181 includes the circuit forming section 181a, the bent unit 181b, the input terminal 181c, the output terminal 181d, and the LED substrate terminal 181e. The circuit forming section 181a is a region indicated by oblique lines in FIG. 14. As shown in FIG. 13, the first FPC substrate 181 is connected to the first liquid crystal panel 173 which is disposed on the side shown by an arrow A. Further, the first FPC substrate 181 is bent so as to wind up the edge of the case 172 in the bent portion 181b, and is disposed on the side shown by an arrow B, that is, on the second surface 172b of the case 172.

As shown in FIG. 14, the first FPC substrate 181 is formed in a frame shape so as to surround the opening 177 in plan view. In the first FPC substrate 181, a first circuit forming section 181a' and a second circuit forming section 181a" face each other with the opening 177 interposed therebetween.

The first circuit forming section 181a' has a bent portion 183 which corresponds to a linear region provided along a virtual line XO passing the center of the first circuit forming section 181a'. The first circuit forming section 181a' can be bent at the bent portion 183. Each of both ends of the bent portion 183 is a portion with a small thickness which is made of only the base film 54 without using the protective film 56 of FIG. 5. An elongated space that penetrates the corresponding bent portion toward an outside surface S2 from an inside surface S1, that is, a slit 184 is formed between both ends each having a small thickness. As such, the slit 184 is provided in the bent portion 183, so that the first FPC substrate 181 can be bent easier at the bent portion 183. Further, in the present embodiment, one slit 184 is formed along the bent portion 183, but slits 184 of two or more can be formed along the bent portion 183 so long as it is possible to ensure a region where necessary wiring lines may be provided on the bent portion 183. In addition, if the first FPC substrate 181 can be easily bent at the bent portion 183, the slit 184 does not need to be provided in the bent portion 183.

In addition, the second circuit forming section 181a" has a bent portion 186 which has the same structure as the bent portion 184, and can be bent at the bent portion 186. Since a slit 187 that penetrates the corresponding bent portion toward an outside surface S2 from an inside surface S1 is formed between both ends, the first FPC substrate 181 can be bent easier at the bent portion 186. Further, in the present embodiment, one slit 187 is formed along the bent portion 186, but slits 187 of two or more can be formed along the bent portion 186 so long as it is possible to ensure a region where necessary wiring lines may be provided on the bent portion 186. In addition, if the first FPC substrate 181 can be easily bent at the bent portion 186, the slit 187 does not need to be provided in the bent portion 186.

In the first FPC substrate 181 according to the present embodiment, an interval t14 between the bent portion 183 of the first circuit forming section 181a' and the bent portion 186 of the second circuit forming section 181a" is equal to or slightly greater than the width t11 between both side surfaces of the case 172. In addition, the width t13 of the opening 177 is equal to or slightly greater than the width t12 of the second accommodating space 192 of the case 172 shown in FIG. 13.

In FIG. 13, a portion between the bent portion 186 and the opening 177 in the second circuit forming portion 181a" is disposed on a planar region 172d between the second liquid crystal panel 174 and the side surface 172c (that is, region indicated by oblique lines) on the second surface 172b of the case 172. The planar region 172d is a region adjacent to both sides of a region in which the second liquid crystal panel 174 is mounted on a side surface on which the second liquid crystal panel 174 of the case 172 is mounted. In addition, a portion of the second circuit forming section 181a" located more at the outer side than the bent portion 186 is bent downward along the side surface 172c of the case 172 in FIG. 13. In addition, the bent surface of the second circuit forming section 181a" is adhered to the side surface 172c of the case 172 by using an adhesive member 188, for example, such as a double-sided tape or the like.

In addition, a portion between the bent portion 183 and the opening 177 in the first circuit forming portion 181a' is disposed on a planar region 172d between the second liquid crystal panel 174 and the side surface 172c (that is, region indicated by oblique lines) on the second surface 172b of the case 172. In addition, a portion of the first circuit forming section 181a' of FIG. 14 located more at the outer side than the bent portion 183 is not shown in FIG. 13, but in the same manner as the second circuit forming section 181a", the portion is bent along the side surface 172c and then is adhered to the side surface 172c of the case 172.

In the fifth embodiment of FIG. 13, the second circuit forming section 181a" is bent such that its surface is opposite to the side surface 172c of the case 172 at the bent portion 186. In the same manner, the first circuit forming section 181a' is bent such that its surface is opposite to the side surface 172c of the case 172 at the bent portion 183. As such, if the circuit forming section 181a of the first FPC substrate 181 is disposed on the side surface 172c of the case 172, even though the case 172 is formed small so as to reduce the size of the liquid crystal display device 171, a large area of the circuit forming section 181a of the first FPC substrate 171 can be ensured. Therefore, the liquid crystal display device 171 having the first FPC substrate 181 can be formed so as to have a small size. In addition, a substantial area of the first FPC substrate 181 can be increased, so that a large-sized circuit can be formed on the circuit forming section 181a of the first FPC substrate 181.

Further, in the present embodiment, the first circuit forming section 181a' and the second circuit forming section 181a", which are portions of the circuit forming section 181a, are provided on the planar region 172d between the second liquid crystal panel 174 and the side surface 172c on the second surface 172b of the case 172. As a result, it is possible to further increase the area of the circuit forming section 181a as compared with the case in which the first circuit forming section 181a' and the second circuit forming section 181a" are provided on only the side surfaces 172c of the case 172. Therefore, it is possible to form a large-sized circuit.

Sixth Embodiment of Electro-Optical Device

Next, an electro-optical device according to a sixth embodiment of the invention will be described. Also, the present embodiment illustrates a liquid crystal display device. In the sixth embodiment, the same reference numerals as the first to fifth embodiments are denoted by the same reference numerals.

Figure 15:
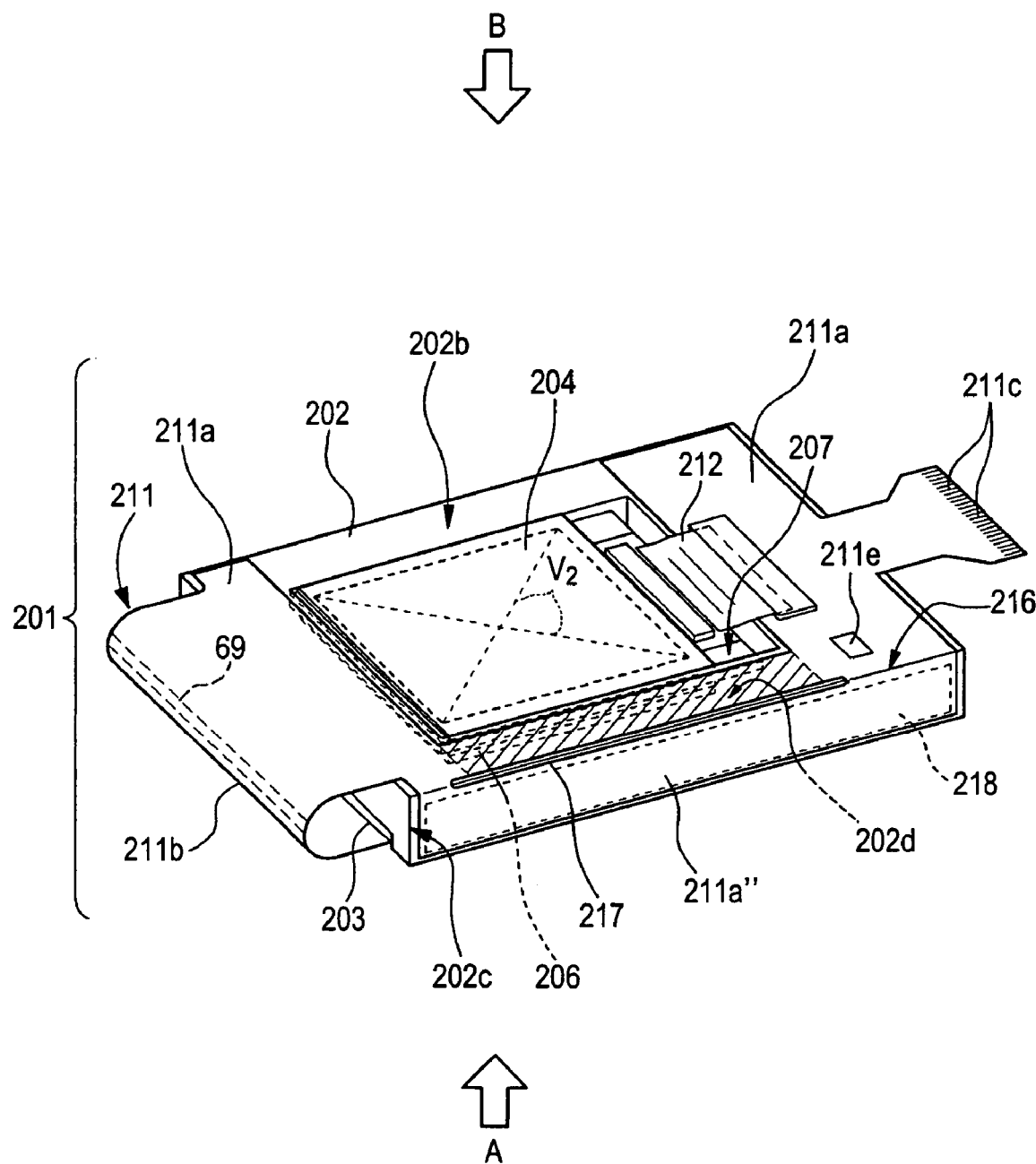
FIG. 15 is a perspective view illustrating yet another embodiment of the electro-optical device according to the invention.
Figure 16:
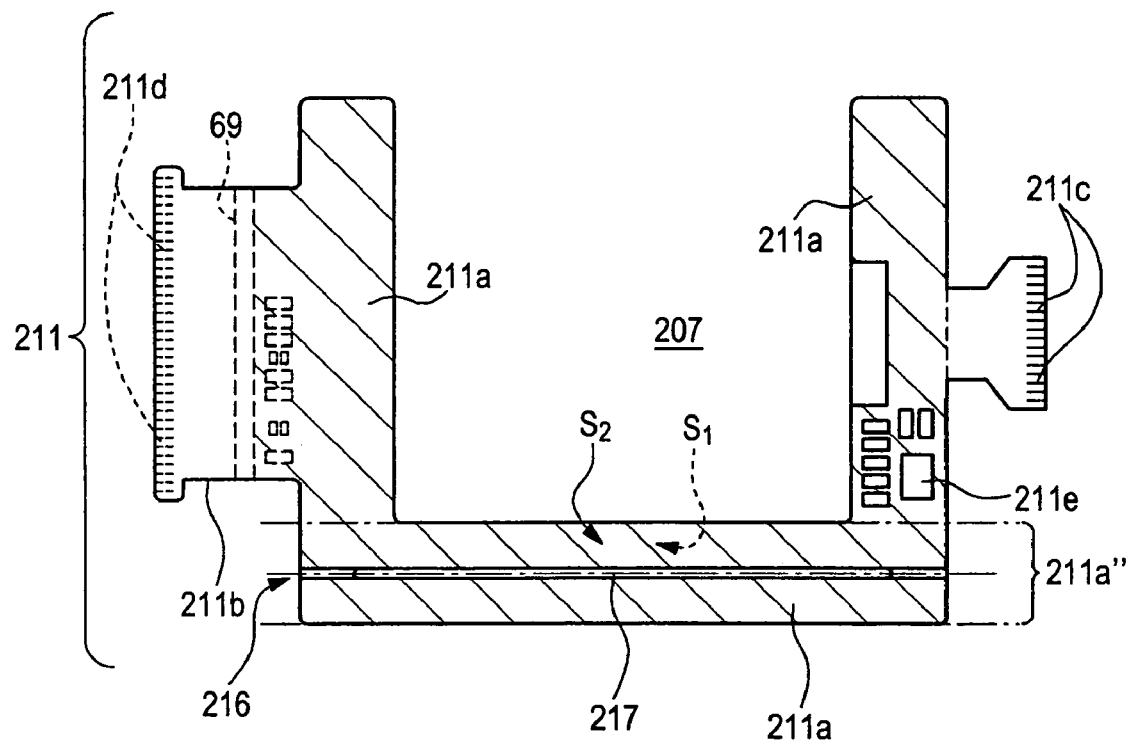
FIG. 16 is a plan view illustrating the detailed structure of a first FPC substrate which is still yet another embodiment of the wiring substrate.

FIG. 15 illustrates a liquid crystal display device 201 according to the sixth embodiment of the invention. FIG. 16 is a plan view of a first FPC substrate 211 of FIG. 15 viewed from an arrow direction B. In FIG. 16, a bent portion 211b is shown in an exploded state. According to the fifth embodiment, as shown in FIG. 14, the circuit forming section 181a of the first FPC substrate 181 is formed in a frame shape so as to surround the opening 177, the circuit forming section on the side of the input terminals 181c and the circuit forming section on the side of the output terminals 181d are provided at both sides of the horizontal direction of FIG. 14 with the opening 177 interposed therebetween, and the first circuit forming section 181a' and the second circuit forming section 181a" are provided at both sides in the vertical direction of FIG. 14 so as to connect the circuit forming sections to each other. Further, as shown in FIG. 13, each of the first circuit forming section 181a' and the second circuit forming section 181a" is provided such that a portion of its surface is opposite to the side surface 172c of the case 172 and another portion of its surface is opposite to the planar region 172d between the second liquid crystal panel 174 and the side surface 172c on the second surface 172b of the case 172.

In the meantime, according to the present embodiment, as shown in FIG. 16, a circuit forming section 211a of a first FPC substrate 211 is formed in a substantially U shape so as to surround the FPC substrate opening 207. A second circuit forming section 211a″ is provided at a portion of the U shape opposite to the opening portion. In FIG. 15, the second circuit forming section 211a″ is provided so as to be opposite to one side surface 202c of the case 202 and the planar region 202d (region indicated by oblique lines) between the second liquid crystal panel 204 and the side surface 202c on the second surface 202b of the case 202 (that is, side surface on which the second liquid crystal panel 204 is mounted). Hereinafter, the difference between the liquid crystal display device 201 of FIG. 15 and the liquid crystal display device 171 of FIG. 13 will be mainly described.

In the liquid crystal display device 201 of FIG. 15, each of a case 202, a second FPC substrate 212, a first liquid crystal panel 203, a second liquid crystal panel 204, and the second illumination device 206 can have the same structure as each of the case 172, the second FPC substrate 182, the first liquid crystal panel 173, the second liquid crystal panel 174, and the second illumination device 176 shown in FIG. 13. In the present embodiment, it is assumed that each of them has the same structure as each of them shown in FIG. 13. In addition, the first FPC substrate 211 of FIG. 16 can have the same structure as the first FPC substrate 181 shown in FIG. 14, except for the shape of the circuit forming section. In the present embodiment, it is assumed that the first FPC substrate 211 of FIG. 16 has the same structure as the first FPC substrate 181 shown in FIG. 14.

In FIG. 16, the first FPC substrate 211 includes a circuit forming section 211a, a bent unit 211b, input terminals 211c, output terminals 211d, and an LED substrate terminal 211e. The circuit forming section 211a is a region which is indicated by oblique lines in FIG. 16. As shown in FIG. 15, the first FPC substrate 211 is connected to the first liquid crystal panel 203 which is disposed on the side shown by an arrow A. Further, the first FPC substrate 211 is bent so as to wind up the edge of the case 202 in the bent portion 211b, and is disposed on the side shown by an arrow B, that is, on the second surface 202b of the case 202.

In FIG. 16, the circuit forming section 211a of the first FPC substrate 211 is formed in a substantially U shape so as to surround the FPC substrate opening 207 in plan view. A portion of the circuit forming section 211a opposite to the portion opened by the FPC substrate opening 207 corresponds to the second circuit forming section 211a‴.

In addition, the second circuit forming section 211a″ has a bent portion 216, and can be bent at the bent portion 216. An elongated space that penetrates the corresponding bent portion toward an outside surface S2 from an inside surface S1, that is, a slit 217 is formed in the bent portion 216. As such, the slit 217 is provided in the bent portion 216, so that the first FPC substrate 211 can be bent easier at the bent portion 216. Further, in the present embodiment, one slit 217 is formed along the bent portion 216, but slits 217 of two or more can be formed along the bent portion 216 so long as it is possible to ensure a region where necessary wiring lines may be provided on the bent portion 216. In addition, if the first FPC substrate 211 can be easily bent at the bent portion 216, the slit 217 does not need to be provided in the bent portion 216.

In FIG. 15, a portion between the bent portion 216 and the opening 207 in the second circuit forming portion 211a″ is disposed on a planar region 202d between the second liquid crystal panel 204 and the side surface 202c (that is, region indicated by oblique lines) on the second surface 202b of the case 202. In addition, a portion of the second circuit forming section 211a″ located more at the outer side than the bent portion 216 is bent downward along the side surface 202c of the case 202 in FIG. 15. In addition, the bent surface of the second circuit forming section 201a″ is adhered to the side surface 202c of the case 202 by using an adhesive member 218, for example, such as a double-sided tape or the like.

In the sixth embodiment of FIG. 15, the second circuit forming section 211a″ is bent such that its surface is opposite to the side surface 202c of the case 202 at the bent portion 216. As such, if the circuit forming section 211a of the first FPC substrate 211 is disposed on the side surface 202c of the case 202, even though the case 202 is made small so as to reduce the size of the liquid crystal display device 201, a large area of the circuit forming section 211a of the first FPC substrate 211 can be ensured. Therefore, the liquid crystal display device 201 having the first FPC substrate 211 can be formed so as to have a small size. In addition, a substantial area of the first FPC substrate 211 can be increased, so that a large-sized circuit can be formed on the circuit forming section 211a of the first FPC substrate 211.

Further, in the present embodiment, the second circuit forming section 211a″, which is a portion of the circuit forming section 211a, is provided on the planar region 202d between the second liquid crystal panel 204 and the side surface 202c on the second surface 202b of the case 202. As a result, it is possible to further increase the area of the circuit forming section 211a as compared with the case in which the second circuit forming section 211a″ is provided on only the side surface 202c of the case 202. Therefore, it is possible to form a large-sized circuit.

Other Embodiment of Electro-Optical Device and Method of Mounting Wiring Substrate Until now, although the preferred embodiments of the invention have been described, the invention is not limited to the above-mentioned embodiments, and various modifications and changes can be made within the scope of the appended claims.

For example, in the above-mentioned embodiments of the electro-optical device, as shown in FIG. 1, the liquid crystal display device 1 having a structure in which the circuit forming section 51a is provided in the first FPC substrate 51 and the portion of the circuit forming section 51a is bent such that its surface is opposite to the side surface 2c of the case 2 has been exemplified. However, the invention may have a structure in which a region other than the circuit forming section is bent. Further, the invention may have a structure in which the second FPC substrate 52 is bent such that its surface is opposite to the side surface 2c of the case 2. Furthermore, the invention may have a structure in which the bent portions are provided in the first FPC substrate 51 and the second FPC substrate 52 and the portions of the first FPC substrate 51 and the second FPC substrate 52 are bent on the basis of the bent portions such that their surfaces are opposite to the side surface 2c of the case 2.

In addition, in the above-mentioned embodiments of the electro-optical device, as shown in FIG. 1, the liquid crystal display device 1 having a structure in which it uses the two liquid crystal panels including the first liquid crystal panel 3 for performing a main display operation and the second liquid crystal panel 4 for performing a secondary display operation has been exemplified. However, the invention can be applied to a liquid crystal display device using one liquid crystal panel.

In addition, in the above-mentioned embodiments of the electro-optical device, as shown in FIG. 6B, the circuit forming section 51a of the first FPC substrate 51 is adhered to the side surface 2c of the case 2 by using the adhesive member 68. Instead of it, a frame for covering the side surface 2c of the case 2 may be provided such that the circuit forming section 51a of the first FPC substrate 51 may push down the side surface 2c of the case 2. Specifically, as shown in FIG. 2, the first frame 85 is provided on the side of the first surface 2a of the case 2, and the second frame 86 is provided on the side of the second surface 2b of the case 2 so as to cover the side surface 2c of the case 2. In addition, the first frame 85 is coupled with the second frame 86, so that the circuit form unit 51a can push down the side surface 2c of the case 2. In addition, for the frame covering the side surface 2c of the case 2, the first frame 85 may be used instead of the first frame 86.

In addition, in the above-mentioned embodiments of the electro-optical device, in each of the bent portions 63 and 66 of the first FPC substrate 51 shown in FIG. 5A, the elongated hole that penetrates the corresponding bent portion toward the outside surface S2 from the inside surface S1, that is, a so-called slit can be provided. Therefore, the first FPC substrate 51 can be bent easier at the bent portions 63 and 66.

Further, the invention can be applied to electro-optical devices other than the liquid crystal display device, for example, an organic EL device, an inorganic EL device, a plasma display (PDP) device, an electrophoretic display (EPD) device, and a field emission display (FED) device.

Embodiment of Electronic Apparatus

Hereinafter, electronic apparatuses according to an embodiment of the invention will be described. In addition, the present embodiment is only an example of the electronic apparatus, and the invention is not limited thereto.

Figure 17:
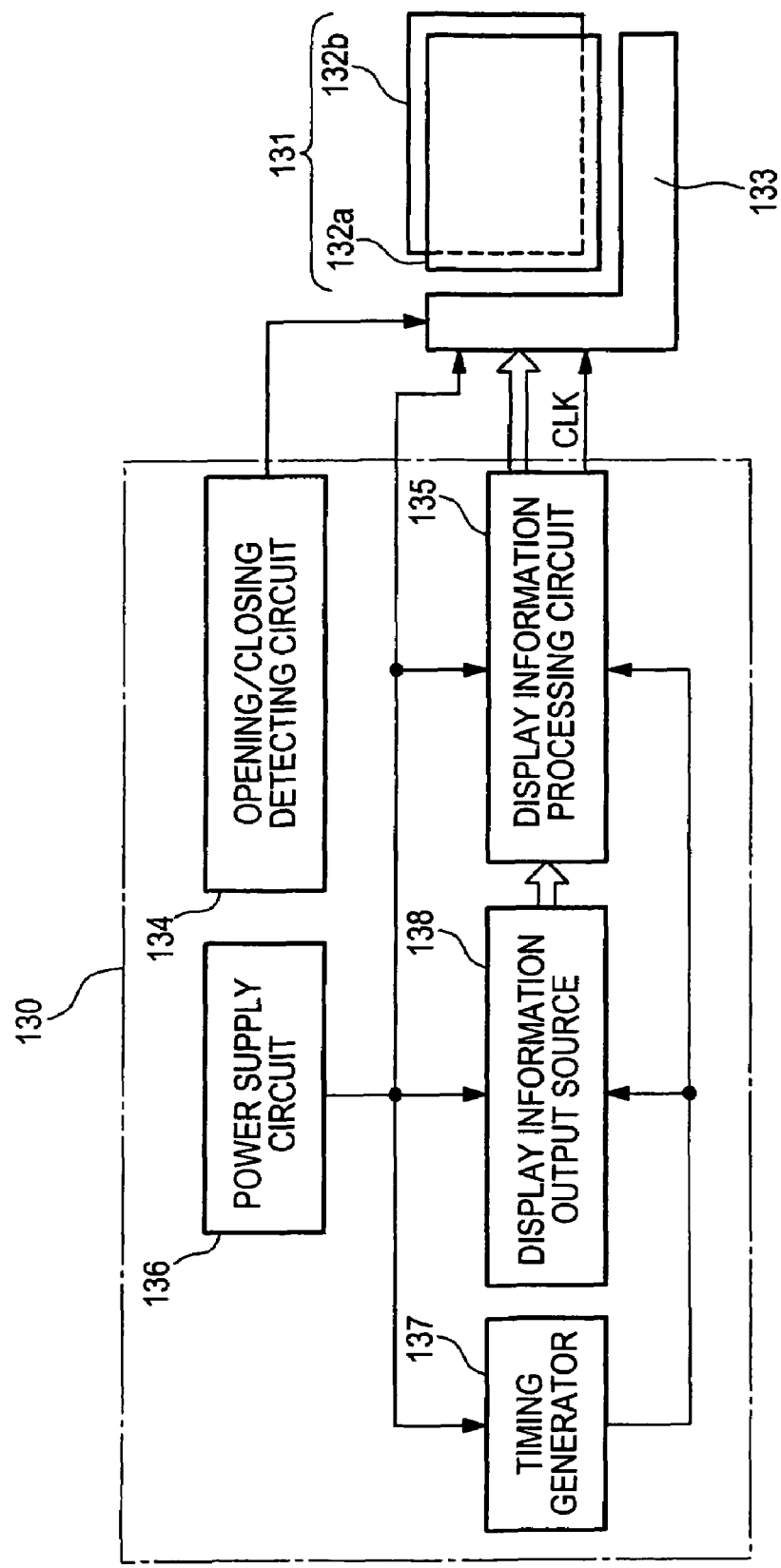
FIG. 17 is a block diagram illustrating an embodiment of an electronic apparatus according to the invention.

FIG. 17 is a block diagram illustrating an electronic apparatus according to an embodiment of the invention. FIG. 18 is a diagram illustrating a foldable cellular phone which is an example of the electronic apparatus shown in the block diagram of FIG. 17. The electronic apparatus shown in FIG. 17 includes a liquid crystal display device 131, and a control circuit 130 for controlling the liquid crystal display device 131. The control circuit 130 has a display information output source 138, a display information processing circuit 135, a power supply circuit 136, and a timing generator 137. In addition, the liquid crystal display device 131 has a first liquid crystal panel 132a, a second liquid crystal panel 132b, and a driving circuit 133.

The display information output source 138 has a memory such as a ROM (read only memory) or a RAM (random access memory), a storage unit such as various disks or the like, and a tuning circuit that simultaneously outputs a digital image signal. The display information output source 138 outputs display information such as an image signal of a predetermined format or the like to the display information processing circuit 135 on the basis of various clock signals generated by the timing generator 137.

Next, the display information processing circuit 135 has various known circuits such as an amplifying/inverting circuit, a rotation circuit, a gamma correction circuit, a clamp circuit or the like, and executes a process of input display information and supplies an image signal and a clock signal CLK to the driving circuit 133. In this case, the driving circuit 133 refers to all of a scanning line driving circuit, a data line driving circuit, a test circuit or the like. In addition, the power supply circuit 136 supplies a predetermined power supply voltage to the various elements.

Figure 18A:
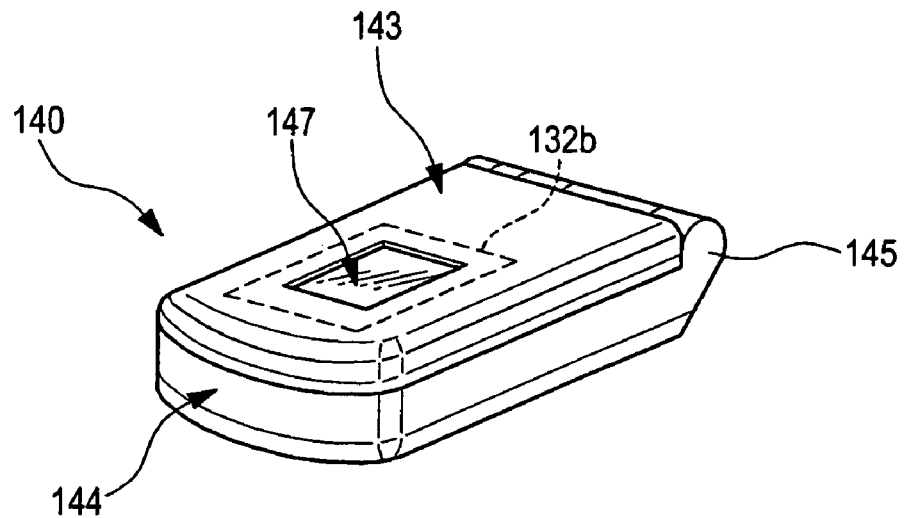
FIG. 18A is a diagram illustrating the appearance in a folded state of the electronic apparatus shown in FIG. 17.
Figure 18B:
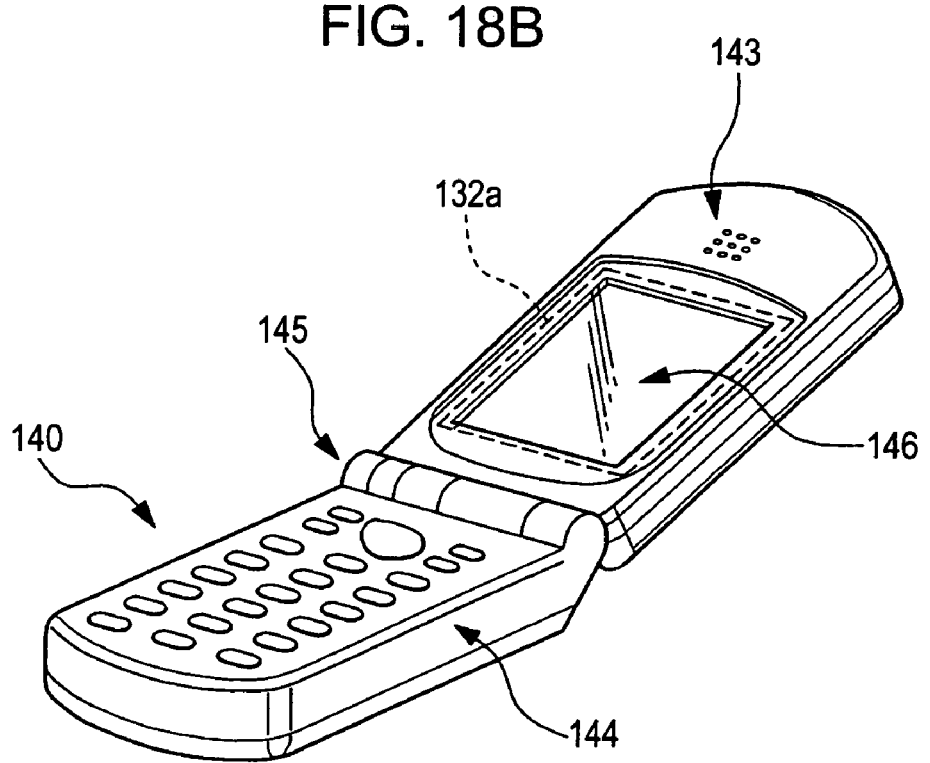
FIG. 18B is a diagram illustrating an unfolded state of the electronic apparatus.

The electronic apparatus shown in the block diagram of FIG. 17 is constructed as, for example, the foldable cellular phone 140 shown in FIGS. 18A and 18B. In the cellular phone 140, a display body 143 including a first liquid panel 132a and a second liquid crystal panel 132b is connected to an operation main body 144 through a hinge portion 145 so as to be opened and closed. The first liquid crystal panel 132a is provided inside the display body 143 as a main display unit 146 performing display when the display body 143 is opened. In addition, the second liquid crystal panel 132b is provided outside the display body 143 as a sub-display unit 147 performing display when the display body 143 is folded in the operation main body 144.

Here, the switching between the display through the main display unit 146 and the display through the sub-display unit 147 is made through the folding operation of the cellular phone 140. For this reason, as shown in FIG. 17, the electronic apparatus includes an opening/closing detection circuit 134 that detects the folding operation of the cellular phone 140. The opening/closing detection circuit 134 outputs the detected result to the liquid crystal display device 131.

The liquid crystal display device 131 of FIG. 17 can be composed of, for example, the liquid crystal display device 1 shown in FIG. 1. In the liquid crystal display device 1, in a region other the side where the first liquid crystal panel 3 and the first FPC substrate 51 are connected, a part of the first FPC substrate 51 is bent such that its surface is opposite to the side surface 2c of the case 2. Thereby, even though the case 2 is made small so as to reduce the size of the liquid crystal display device 1, a large area of the circuit forming section 51a on the first FPC substrate 51 can be ensured. If the case 2 is formed to have a small size, it is possible to reduce the size of the liquid crystal display device 1 having the first FPC substrate 51. In addition, if the liquid crystal display device 1 can be formed to have a small size, it is possible to reduce the entire shape of the cellular phone 140 of FIG. 18 using the liquid crystal display device 1.

Modification

In addition, examples of the electronic apparatuses may include a personal computer, a liquid crystal television, a view-finder-type or monitor-direct-view-type video tape recorder, a car navigation device, a pager, an electronic note, an electronic calculator, a word processor, a work station, a video phone, a POS terminal or the like, in addition to the above-mentioned cellular phone.

What is claimed is:
1. An electro-optical device, comprising:
an electro-optical panel which has a display surface, a first side surface approximately orthogonal to the display surface, a second side surface approximately orthogonal to the display surface and placed adjacently in a direction to intersect with the first side surface, and a third side surface approximately orthogonal to the display surface and opposite to the first side surface;
a supporting member which supports the electro-optical panel and has at least a fourth side surface opposite to the first side surface of the electro-optical panel, a fifth side surface opposite to the second side surface of the electro-optical panel, and a sixth side surface opposite to the third side surface of the electro-optical panel; and
a flexible wiring substrate having at least a first portion including output terminals, a second portion including wiring lines, and a third portion including input terminals;
wherein the first portion of the flexible wiring substrate is connected to the electro-optical panel and bent along the fourth side surface of the supporting member, the second portion of the flexible wiring substrate is bent toward the fifth side surface of the supporting member and touches the fifth side surface of the supporting member, and the third portion of the flexible wiring substrate is placed adjacent to the sixth side surface of the supporting member, wherein the wiring lines of the second portion of the flexible wiring substrate electrically connect from the output terminals of the first portion of the flexible wiring substrate to the input terminals of the third portion of the flexible wiring substrate.

2. The electro-optical device according to claim 1, the first portion of the wiring substrate being bent toward a rear side of the electro-optical panel to connect to the electro-optical panel.

3. The electro-optical device according to claim 1, the supporting member being a case which accommodates the electro-optical panel.

4. The electro-optical device according to claim 1, the second portion of the wiring substrate that is arranged over the fourth side surface of the supporting member being adhered to the fourth side surface of the supporting member.

5. The electro-optical device according to claim 1, further comprising:
a frame which covers the fourth side surface of the supporting member; and
the second portion of the wiring substrate which is arranged over the fourth side surface of the supporting member being pressed by the frame.

6. The electro-optical device according to claim 1, the wiring substrate having wiring lines and a protective film formed on the wiring lines; and
the protective film not being formed in a bent section of the wiring substrate.

7. The electro-optical device according to claim 1, a slit being formed in a bent section of the wiring substrate.

8. The electro-optical device according to claim 1, a cutout being provided in an edge of a bent section of the wiring substrate.

9. An electro-optical device, comprising:
a first electro-optical panel which has a display surface, a first side surface approximately orthogonal to the display surface, a second side surface approximately orthogonal to the display; surface and placed adjacently in a direction to intersect with the first side surface, and a third side surface approximately orthogonal to the display surface and opposite to the first side surface;
a second electro-optical panel which is provided on a rear side of the first electro-optical panel;
a supporting member which supports the first electro-optical panel and the second electro-optical panel and has at least a fourth side surface opposite to the first side surface of the first electro-optical panel and a fifth side surface opposite to the second side surface of the first electro-optical panel, and a sixth side surface opposite to the third side surface of the electro-optical panel; and
a first flexible wiring substrate which is connected to the first electro-optical panel and is bent toward the second electro-optical panel;
a second flexible wiring substrate which is connected to the second electro-optical panel; and
the first flexible wiring substrate having at least a first portion including output terminals, a second portion including wiring lines, and a third portion including input terminals;
wherein the first portion of the first flexible wiring substrate is connected to the first electro-optical panel and bent along the fourth side surface of the supporting member, the second portion of the first flexible wiring substrate is bent toward the fifth side surface of the supporting member and touches the fifth side surface of the supporting member, and the third portion of the flexible wiring substrate is placed adjacent to the sixth side surface of the supporting member, wherein the wiring lines of the second portion of the flexible wiring substrate electrically connect from the output terminals of the first portion of the flexible wiring substrate to the input terminals of the third portion of the flexible wiring substrate.

10. A method of mounting a wiring substrate, comprising:
preparing an electro-optical panel which has a display surface, a first side surface approximately orthogonal to the display surface, a second side surface approximately orthogonal to the display surface and placed adjacently in a direction to intersect with the first side surface, and a third side surface approximately orthogonal to the display surface and opposite to the first side surface;
preparing a supporting member which supports the first electro-optical panel and has at least a fourth side surface opposite to the first side surface of the electro-optical panel, a fifth side surface opposite to the second side surface of the electro-optical panel, and a sixth side surface opposite to the third side surface of the electro-optical panel;
connecting a first portion of a flexible wiring substrate to the electro-optical panel, the first portion including output terminals, and the flexible wiring substrate also having a second portion including wiring lines, and a third portion including input terminals;
housing the electro-optical panel in a supporting member so that the first portion of the flexible wiring substrate is bent along the fourth side surface of the supporting member; and
bending the second portion of the flexible wiring substrate toward the fifth side surface of the supporting member and touching the fifth side surface of the supporting member, and placing the third portion of the flexible wiring substrate adjacent to the sixth side surface of the supporting member,
wherein the wiring lines of the second portion of the flexible wiring substrate electrically connect from the output terminals of the first portion of the flexible wiring substrate to the input terminals of the third portion of the flexible wiring substrate.

11. An electronic apparatus, comprising:
the electro-optical device according to claim 1.

12. The electro-optical device according to claim 1, the second side surface of the electro-optical panel being adjacent to the first side surface of the electro-optical panel.

13. The electro-optical device according to claim 1, the second side surface of the electro-optical panel being opposite to the first side surface of the electro-optical panel.

14. The electro-optical device according to claim 9, the second side surface of the first electro-optical panel being adjacent to the first side surface of the first electro-optical panel.

15. The electro-optical device according to claim 9, the second side surface of the first electro-optical panel being opposite to the first side surface of the first electro-optical panel.

16. The method of mounting a wiring substrate according to claim 10, the second side surface of the electro-optical panel being adjacent to the first side surface of the electro-optical panel.

17. The method of mounting a wiring substrate according to claim 10, the second side surface of the electro-optical panel being opposite to the first side surface of the electro-optical panel.

* * * * *